United States Patent
Ishii et al.

(10) Patent No.: US 9,817,091 B2
(45) Date of Patent: Nov. 14, 2017

(54) MAGNETIC RESONANCE IMAGING APPARATUS AND RF COIL DEVICE

(71) Applicant: TOSHIBA MEDICAL SYSTEMS CORPORATION, Otawara-Shi, Tochigi-Ken (JP)

(72) Inventors: Manabu Ishii, Otawara (JP); Sadanori Tomiha, Nasushiobara (JP); Hiroshi Hayakawa, Otawara (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 733 days.

(21) Appl. No.: 14/246,299

(22) Filed: Apr. 7, 2014

(65) Prior Publication Data

US 2014/0218034 A1    Aug. 7, 2014

Related U.S. Application Data

(63) Continuation of application No. PCT/JP2014/050560, filed on Jan. 15, 2014.

(30) Foreign Application Priority Data

Jan. 16, 2013    (JP) ................................ 2013-005414

(51) Int. Cl.
*G01R 33/36*     (2006.01)
*G01R 33/3415*   (2006.01)

(52) U.S. Cl.
CPC ...... *G01R 33/3692* (2013.01); *G01R 33/3415* (2013.01)

(58) Field of Classification Search
CPC .............. G01R 33/3692; G01R 33/283; G01R 33/3621; G01R 33/28; G01R 33/3415;
(Continued)

(56) References Cited

U.S. PATENT DOCUMENTS

| 5,384,536 A * | 1/1995 | Murakami | G01R 33/28 324/309 |
| 7,548,787 B2 * | 6/2009 | Feher | H04W 64/00 607/60 |

(Continued)

FOREIGN PATENT DOCUMENTS

| CN | 101325427 A | 12/2008 |
| CN | 102540118 A | 7/2012 |

(Continued)

OTHER PUBLICATIONS

English Translation of International Preliminary Report on Patentability dated Jul. 21, 2015 for Application No. PCT/JP2014/050560.

(Continued)

*Primary Examiner* — Clayton E Laballe
*Assistant Examiner* — Ruifeng Pu
(74) *Attorney, Agent, or Firm* — Nixon & Vanderhye P.C.

(57) ABSTRACT

According to one embodiment, an MRI apparatus includes a first RF coil device, a radio communication unit and an image reconstruction unit. The first RF coil device is wirelessly connected to a second RF coil device, and receives a nuclear magnetic resonance signal wirelessly transmitted from the second RF coil device. The first RF coil device wirelessly transmits the nuclear magnetic resonance signal detect by the first RF coil device and the nuclear magnetic resonance signal obtained from the second RF coil device to the radio communication unit, via an induced electric field. The radio communication unit receives the nuclear magnetic resonance signals wirelessly transmitted from the first RF coil device via an induced electric field. The image reconstruction unit reconstructs image data on the basis of the nuclear magnetic resonance signals received by the radio communication unit.

6 Claims, 12 Drawing Sheets

(58) Field of Classification Search
CPC ............ G01R 33/3806; G01R 33/4625; G01R 33/4833; G01R 33/567; G01R 33/5673; A61B 5/055; H04B 1/1036; H04B 1/69; H04B 5/02; H04B 7/04; G06F 19/321; G06F 19/32

See application file for complete search history.

(56) References Cited

U.S. PATENT DOCUMENTS

| | | | |
|---|---|---|---|
| 7,750,635 B2 | 7/2010 | Van Helvoort et al. | |
| 2003/0078004 A1* | 4/2003 | Vester | G01R 33/3692 455/42 |
| 2005/0107681 A1* | 5/2005 | Griffiths | A61B 5/0046 600/410 |
| 2006/0166681 A1* | 7/2006 | Lohbihler | G01S 5/02 455/456.2 |
| 2008/0259897 A1* | 10/2008 | Van Helvoort | G01R 33/283 370/345 |
| 2008/0311849 A1 | 12/2008 | Washiro | |
| 2010/0119138 A1* | 5/2010 | Hulbert | G01R 33/3415 382/131 |
| 2011/0101977 A1* | 5/2011 | Nakanishi | G01R 33/3692 324/307 |
| 2012/0032678 A1* | 2/2012 | Vaughan, Jr. | G01R 33/3415 324/318 |
| 2012/0161773 A1 | 6/2012 | Evers et al. | |
| 2012/0299593 A1 | 11/2012 | Biber | |
| 2014/0021954 A1* | 1/2014 | Okamoto | G01R 33/3692 324/322 |
| 2014/0021956 A1* | 1/2014 | Tomiha | G01R 33/3692 324/322 |
| 2014/0062485 A1* | 3/2014 | Okamoto | G01R 33/3692 324/322 |
| 2014/0070811 A1* | 3/2014 | Tomiha | G01R 33/36 324/322 |
| 2014/0097844 A1* | 4/2014 | Tomiha | G01R 33/3692 324/321 |
| 2014/0218034 A1* | 8/2014 | Ishii | G01R 33/3692 324/322 |
| 2014/0266190 A1* | 9/2014 | Bollenbeck | G01R 33/3692 324/307 |
| 2015/0335243 A1* | 11/2015 | Assmann | A61B 7/04 600/301 |
| 2016/0021219 A1* | 1/2016 | Brown | A61B 6/541 370/216 |
| 2016/0069969 A1* | 3/2016 | Tomiha | G01R 33/56554 324/322 |
| 2016/0077175 A1* | 3/2016 | Mori | G01R 33/3692 324/321 |
| 2016/0154074 A1* | 6/2016 | Okamoto | G01R 33/5659 324/322 |
| 2016/0187434 A1* | 6/2016 | Boskamp | G01R 33/34076 324/309 |
| 2016/0216346 A1* | 7/2016 | Rehner | G01R 33/24 |

FOREIGN PATENT DOCUMENTS

| | | |
|---|---|---|
| CN | 102540121 A | 7/2012 |
| JP | 2008-518652 | 6/2008 |
| JP | 2008-311960 | 12/2008 |
| JP | 2010-029644 | 2/2010 |
| JP | 2011-092553 | 5/2011 |
| JP | 2011-248767 | 12/2011 |

OTHER PUBLICATIONS

U.S. Appl. No. 13/945,370, filed Jul. 18, 2013.
U.S. Appl. No. 14/012,274, filed Jul. 22, 2013.
U.S. Appl. No. 14/045,348, filed Aug. 5, 2013.
U.S. Appl. No. 14/058,700, filed Sep. 9, 2013.
U.S. Appl. No. 14/104,544, filed Sep. 11, 2013.
Chinese office action dated Apr. 1, 2017, in Patent Application No. CN 201480004871.9.

* cited by examiner

MAGNETIC RESONANCE IMAGING APPARATUS AND RF COIL DEVICE

CROSS-REFERENCE TO RELATED APPLICATIONS

This application is a Continuation application of No. PCT/JP2014/50560, filed on Jan. 15, 2014, and the PCT application is based upon and claims the benefit of priority from Japanese Patent Application No. 2013-5414, filed on Jan. 16, 2013, the entire contents of which are incorporated herein by reference.

FIELD OF THE INVENTION

Embodiments described herein relate generally to a magnetic resonance imaging apparatus and an RF coil device.

DESCRIPTION OF THE RELATED ART

MRI is an imaging method which magnetically excites nuclear spin of an object (a patient) placed in a static magnetic field with an RF pulse having the Larmor frequency and reconstructs an image on the basis of MR signals generated due to the excitation. The aforementioned MRI means magnetic resonance imaging, the RF pulse means a radio frequency pulse, and the MR signal means a nuclear magnetic resonance signal.

Here, an RF (Radio Frequency) coil device is a device which transmits an RF pulse to nuclear spin inside an object by, for example, supplying a coil with an RF pulse electric current and detects generated MR signals.

Some of RF coil devices are built-in types included in an MRI apparatus and other RF coil devices are recognized by a control unit of the MRI apparatus by being connected to a connection port of the MRI apparatus such as local RF coil devices, for example.

In MRI, multi-channel structure is promoted in acquisition system of MR signals. The above "channel" means each pathway of a plurality of MR signals outputted from each coil element and inputted to an RF receiver of an MRI apparatus. Although the number of the channels is determined to be equal to or smaller than the input reception number of the RF receiver, a large number of RF coil devices can be connected to an MRI apparatus.

If the number of cables between an RF coil device and an MRI apparatus increases due to promotion of the aforementioned multichannel structure, it is inconvenient because hard-wiring becomes complicated.

Therefore, it is desired to unwire transmission and reception of signals between an RF coil device and an MRI apparatus. However, radio communication by an analogue signal has not been achieved, because there are various restrictions such as degradation of dynamic range.

More specifically, in order to suppress influence on receiving sensitivity to weak MR signals emitted from an object, it is impossible in an MRI apparatus to enlarge the output of electromagnetic waves used for radio communication between an RF coil device and an MRI apparatus. If it is impossible to enlarge the radio output power, dynamic range degrades due to signal loss caused when transmitted signals travel space. Then, in Japanese Patent Application Laid-open (KOKAI) Publication No. 2010-29664, a digital radio communication method in which MR signals are digitized and then transmitted wirelessly is proposed.

Although the problem of the restriction of the dynamic range can be solved by wirelessly transmitting MR signals after digitalization, this method has the following problems.

Firstly, regulation of radio communication is different from country to country, and the same transmission frequency or the same transmission power cannot be necessarily used in other countries.

Secondly, if MR signals are wirelessly transmitted from an RF coil device to an MRI apparatus, the transmitted radiowaves are reflected off surrounding areas and this degrades own data of radio communication.

Therefore, a novel technology to wirelessly transmit digitized MR signals from an RF coil device to an MRI apparatus satisfactorily has been desired in MRI.

DETAILED DESCRIPTION

Figure 1:
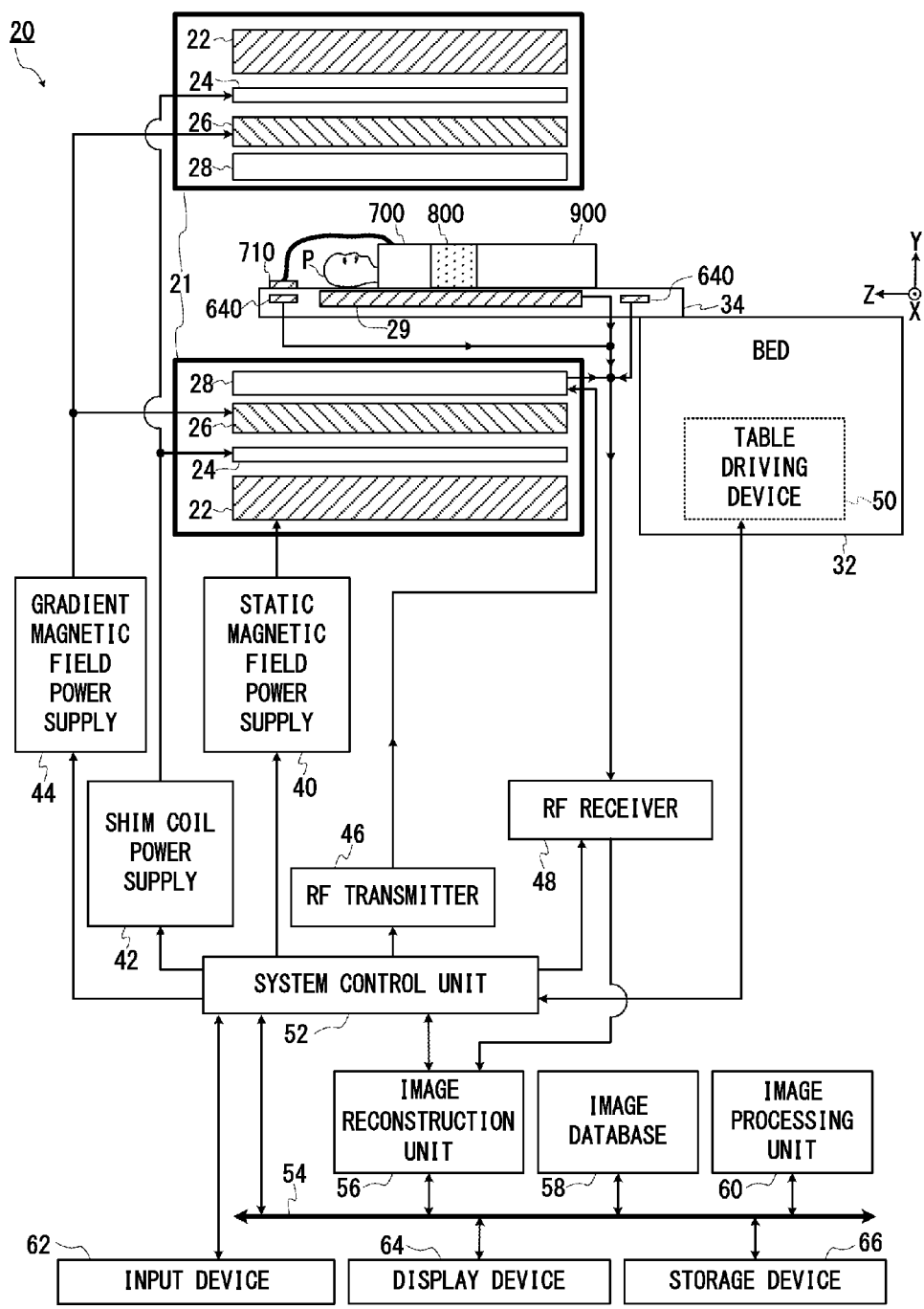
FIG. 1 is a block diagram showing the general structure of the MRI apparatus of the present embodiment.

In the following embodiments, a data transmitting connector of an RF coil device is detachably fixed to a radio communication device (data collecting connector) of an MRI apparatus within near distance, and digitized MR signals are wirelessly transmitted from the RF coil device to the radio communication device of the MRI apparatus via an induced electric field.

The aforementioned assignment of satisfactorily wirelessly transmitting digitized MR signals from an RF coil device to an MRI apparatus can be achieved by the above novel technology. This technology is a never-before-published technology at the time of Japanese filing date of Japanese Patent Application No. 2013-5414 on which the present application claims the benefit of priority under the Paris convention.

Here, as to applying the above radio communication via an induced electric field to transmission of MR signals from an RF coil device side to a control side of an MRI apparatus, connection methods such as an installation position of the RF coil device or the like have not been considered sufficiently. Thus, a connection method with high degree of freedom has been desired.

Then, in the following embodiments, it is a further assignment to improve degree of freedom of connection methods of RF coil devices in radio communication between an RF coil device side and a control side of an MRI apparatus via an induced electric field.

Hereinafter, examples of aspects which embodiments of the present invention can take will be explained per aspect.

(1) According to one embodiment, an MRI apparatus includes a first RF coil device, a radio communication unit and an image reconstruction unit.

The first RF coil device detects an MR signal emitted from an object. In addition, the first RF coil device includes an other-coil connecting unit.

The other-coil connecting unit is wirelessly connected to a second RF coil device via an induced electric field, and receives a digitized MR signal wirelessly transmitted from the second RF coil device.

The first RF coil device wirelessly transmits the MR signal received by the other-coil connecting unit and the MR signal detected by the first RF coil device to the radio communication unit via an induced electric field.

The radio communication unit receives the MR signals wirelessly transmitted from the first RF coil device via an induced electric field.

The image reconstruction unit reconstructs image data of the object on the basis of the MR signals received by the radio communication unit.

(2) According to another embodiment, an MRI apparatus obtains an MR signal from an RF coil device which detects the MR signal emitted from an object. This MRI apparatus includes a table, a first radio communication unit, a second radio communication unit and an image reconstruction unit.

The object is placed on the table.

The first radio communication unit obtains the MR signal detected by the RF coil device, and wirelessly transmit the MR signal in a digitized state via an induced electric field.

The second radio communication unit is connected to hard-wiring inside the table by wire, and is disposed on the table in such a manner that its position can be changed. The second radio communication unit receives the MR signal wirelessly transmitted from the first radio communication unit via the induced electric field.

The image reconstruction unit reconstructs image data of the object on the basis of the MR signal received by the second radio communication unit and transmitted via the hard-wiring inside the table.

(3) According to another embodiment, an RF coil device is for transmitting MR signals to an MRI apparatus and includes a coil element, a first communication unit and a second communication unit.

The coil element detects an MR signal emitted from an object.

The first communication unit is connected to another RF coil device via an induced electric field and receives a digitized MR signal wirelessly transmitted from said another RF coil device.

The second communication unit wirelessly transmits the MR signal received by the first communication unit and the MR signal detected by the coil element to the MRI apparatus in a digitized state via an induced electric field.

In the following, some examples of embodiments of the RF coil devices, the MRI apparatuses and the MRI methods will be described with reference to the accompanying drawings. Note that the same reference numbers are given for identical components in each figure, and overlapping explanation is abbreviated.

<Structure of the Present Embodiment>

FIG. 1 is a block diagram showing an example of the general structure of the MRI apparatus 20 according to the present embodiment. As shown in FIG. 1, the MRI apparatus 20 includes a gantry 21, a bed 32 and a table 34. The table 34 is movably disposed on the bed 32 so as to be supported by the bed 32. An object P is placed on the table 34.

In addition, in the gantry 21 which is cylinder-shaped as an example, the MRI apparatus 20 includes a static magnetic field magnet 22, a shim coil 24, a gradient magnetic field coil 26 and a transmission RF coil 28. The gantry 21 corresponds to the parts indicated as two bold line frames in FIG. 1.

The static magnetic field magnet 22 and the shim coil 24 are, for example, cylinder-shaped. Inside the static magnetic field magnet 22, the shim coil 24 is arranged so as to become coaxial with the static magnetic field magnet 22.

As an example here, an apparatus coordinate system, whose X axis, Y axis and Z axis are perpendicular to each other, is defined as follows.

Firstly, it is assumed that the static magnetic field magnet 22 and the shim coil 24 are arranged in such a manner that their axis direction is perpendicular to the vertical direction. And the direction of the axis of the static magnetic field magnet 22 and the shim coil 24 is defined as the Z axis direction. In addition, it is assumed that the vertical direction is the same as the Y axis direction. Moreover, it is assumed that the table 34 is disposed in such a position that the direction of the normal line of the loading plane thereof is the same as the Y axis direction.

The MRI apparatus 20 includes, on its control side, a static magnetic field power supply 40, a shim coil power supply 42, a gradient magnetic field power supply 44, an RF transmitter 46, an RF receiver 48, a table driving device 50, a system control unit 52, a system bus 54, an image reconstruction unit 56, an image database 58, an image processing unit 60, an input device 62, a display device 64 and a storage device 66. Incidentally, the table driving device 50 is arranged inside the bed 32.

The static magnetic field magnet 22 forms a static magnetic field in an imaging space by using an electric current supplied from the static magnetic field power supply 40. The aforementioned "imaging space" means, for example, a space in the gantry 21 in which the object P is placed and to which a static magnetic field is applied.

The static magnetic field magnet 22 includes a superconductivity coil in many cases. The static magnetic field magnet 22 gets the electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The shim coil 24 is electrically connected to the shim coil power supply 42 and uniforms the static magnetic field with the electric current supplied from the shim coil power supply 42.

The gradient magnetic field coil 26 is, for example, shaped in the form of a cylinder inside the static magnetic field magnet 22. The gradient magnetic field coil 26 generates a gradient magnetic field Gx in the X axis direction, a gradient magnetic field Gy in the Y axis direction and a gradient magnetic field Gz in the Z axis direction in the imaging region, by using electric currents supplied from the gradient magnetic field power supply 44.

That is, directions of a gradient magnetic field Gss in a slice selection direction, a gradient magnetic field Gpe in a phase encoding direction and a gradient magnetic field Gro in a readout (frequency encoding) direction can be arbitrarily selected as logical axes, by combining the gradient magnetic fields Gx, Gy and Gz in the three axes of the apparatus coordinate system.

Note that, the above "imaging region" means, for example, at least a part of an acquisition range of MR signals used to generate one image or one set of image, which becomes an image. When MR signals are acquired in a range wider than a region made into an image in order to prevent aliasing (artifact), the imaging region is a part of the acquisition range of MR signals. On the other hand, in some cases, the entire acquisition range of MR signals becomes an image, i.e. the imaging region and the acquisition range of MR signals agree with each other. In addition, the above "one set of images" means, for example, a plurality of images when MR signals of the plurality of images are acquired in a lump in one pulse sequence such as multi-slice imaging.

The RF transmitter 46 generates RF pulses (RF pulse electric currents) of the Larmor frequency for causing nuclear magnetic resonance in accordance with control information provided from the system control unit 52, and transmits the generated RF pulses to the transmission RF coil 28.

The transmission RF coil 28 transmits RF pulses given from the RF transmitter 46 to the object P. The transmission RF coil 28 also includes a whole body coil (not shown) which is included in the gantry 21 and used for both transmission of RF pulses and detection of MR signals.

The reception RF coil 29 is disposed inside the table 34. The reception RF coil 29 detects MR signals generated due to excited nuclear spin inside the object P by the RF pulse, and transmits the detected MR signals to the RF receiver 48.

In the example of the present embodiment, a chest part RF coil device 700, a pelvic part RF coil device 800 and a lower limb RF coil device 900 are loaded on the object P. These chest part RF coil device 700, the pelvic part RF coil device 800 and the lower limb RF coil device 900 are wearable local RF coil devices for detecting MR signals.

It is assumed that each of the chest part RF coil device 700, the pelvic part RF coil device 800 and the lower limb RF coil device 900 is a part of the MRI apparatus 20 as an example here. However, each of these RF coil devices may be interpreted as a unit independent from the MRI apparatus 20.

In addition, a plurality of data collecting connectors (radio communication devices) 640 which receive MR signals detected by the above chest part RF coil device 700, the pelvic part RF coil device 800 and the lower limb RF coil device 900 by wireless connection via induced electric fields are arranged inside the table 34. Details of the arrangement of the data collecting connectors 640 will be described later with FIG. 2 and FIG. 3.

As the aforementioned connection method with high degree of freedom, in the example of the present embodiment, the chest part RF coil device 700, the pelvic part RF coil device 800 and the lower limb RF coil device 900 are connected with each other in series, and only one of these RF coil devices is directly connected to the data collecting connector 640 (see later-described FIG. 6 to FIG. 8).

One data collecting connector 640 performs the aforementioned radio communication of digitized MR signals with one RF coil device. Here, though only one data collecting connector 640 is used in the present embodiment, this is only an example. A plurality of the data collecting connectors 640 may be used.

More specifically, for example, the chest part RF coil device 700 and the pelvic part RF coil device 800 may be connected with each other in series and connected to one data collecting connector 640, and the lower limb RF coil device 900 may be solely connected to another data collecting connector 640.

Note that, though only two of the data collecting connectors 640 are shown in FIG. 1 for the sake of avoiding complication, the number of the data collecting connectors 640 may be one, three or more than three.

However, the configuration of including many of the data collecting connectors 640 is more preferable than the configuration of including only one data collecting connector 640. This is because the former has more choices to closely fix a data transmitting connector of an RF coil device (see later-described FIG. 5 to FIG. 8) to the data collecting connector 640.

In other words, if there are more choices of fixing positions, the data collecting connector 640 can be closely fixed to the nearest data transmitting connector of an RF coil device. The aforementioned "closely fix" means, for example, to fix mutually immovably within a range (distance) of being mutually electromagnetically coupled so as to be capable of radio communication via an induced electric field.

In addition, as an example in the present embodiment, transmission of an RF pulse to the transmission RF coil 28 inside the MRI apparatus 20 and transmission of MR signals detected from the object P are performed under wire transmission except the following three pathways where radio communication is performed.

Radio communication is performed (1) in the pathway between the data collecting connector 640 and the chest part RF coil device 700, (2) in the pathway between the chest part RF coil device 700 and the pelvic part RF coil device 800, and (3) in the pathway between the pelvic part RF coil device 800 and the lower limb RF coil device 900.

The RF receiver 48 generates complex number data of digitized MR signals (hereinafter, referred to as raw data of MR signals) by performing predetermined signal processing on the received MR signals. The RF receiver 48 inputs the generated raw data of MR signals to the image reconstruction unit 56.

The system control unit 52 performs system control of the entirety of the MRI apparatus 20 in imaging operation and an image display after the imaging operation via interconnection lines such as the system bus 54.

For the sake of achieving the above control, the system control unit 52 stores control information needed in order to make the gradient magnetic field power supply 44, the RF transmitter 46 and the RF receiver 48 drive. The aforementioned control information includes, for example, sequence information describing operation control information such as intensity, application period and application timing of the pulse electric currents which should be applied to the gradient magnetic field power supply 44.

The system control unit 52 generates the gradient magnetic fields Gx, Gy and Gz and RF pulses by driving the gradient magnetic field power supply 44, the RF transmitter 46 and the RF receiver 48 in accordance with a predetermined sequence stored.

In addition, the system control unit 52 makes the table 34 move into and out of the imaging space in the gantry 21 in the Z axis direction by controlling the table driving device 50.

In addition, the system control unit 52 can change the height of the bed 32 so as to move up and down the table 34 in the Y axis direction by controlling the table driving device 50.

The system control unit 52 locates the imaging part of the object P near to the center of the magnetic field in the imaging space by controlling the position of the table 34 in the above manner.

In addition, the system control unit 52 functions as an imaging condition setting unit. That is, the system control unit 52 sets the imaging conditions of the main scan on the basis of some of the imaging conditions and information inputted to the input device 62 by a user. For the sake of achieving this, the system control unit 52 makes the display device 64 display screen information for setting the imaging conditions.

The aforementioned term "imaging condition" refers to under what condition an RF pulse or the like is transmitted in what type of pulse sequence, or under what condition MR signals are acquired from the object P, for example. As parameters of the imaging conditions, for example, there are the imaging region as positional information in the imaging space, an imaging part, the type of the pulse sequence such as parallel imaging, the type of RF coil devices used for imaging, the number of slices, an interval between respective slices and so on.

The above "imaging part" means a region of the object P to be imaged as an imaging region, such as a head, a chest and an abdomen.

The aforementioned "main scan" is a scan for imaging an intended diagnosis image such as a proton density weighted image, and it does not include a scan for acquiring MR signals for a scout image or a calibration scan.

A scan is an operation of acquiring MR signals, and it does not include image reconstruction processing.

The calibration scan is, for example, a scan for determining unconfirmed elements of imaging conditions, conditions and data used for image reconstruction processing and so on, and it is performed separately from the main scan.

The after-mentioned prescan is a calibration scan which is performed before the main scan.

The input device 62 provides a user with a function to set imaging conditions and image processing conditions.

The image reconstruction unit 56 converts the raw data of MR signals inputted from the RF receiver 48 into, for example, matrix data on the basis of a phase encode step number and a frequency encode step number, and stores the converted data as k-space data. The k-space means a frequency space (Fourier space).

The image reconstruction unit 56 generates image data of the object P by performing image reconstruction processing including such as two-dimensional Fourier transformation on the k-space data. The image reconstruction unit 56 stores the generated image data in the image database 58.

The image processing unit 60 takes in the image data from the image database 58, performs predetermined image processing on them, and stores the image data after the image processing in the storage device 66 as display image data.

The storage device 66 stores the display image data after adding accompanying information such as the imaging conditions used for generating the display image data and information of the object P (patient information) to the display image data.

The display device 64 displays a screen for setting imaging conditions of the main scan and images indicated by the image data under control of the system control unit 52.

Figure 2:
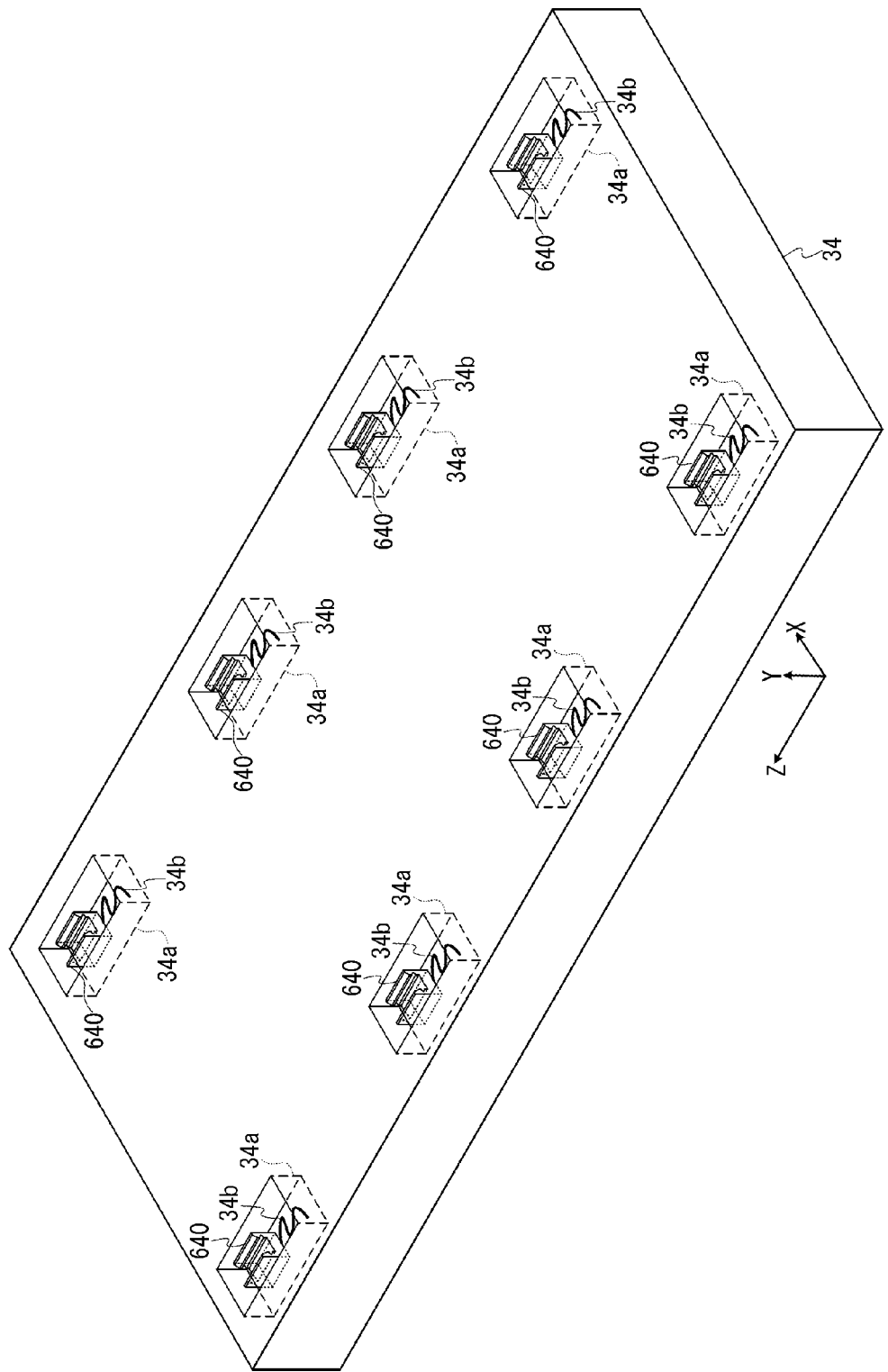
FIG. 2 is a schematic oblique perspective figure showing an example of the arrangement of the data collecting connectors in the table.

FIG. 2 is a schematic oblique perspective figure showing an example of arrangement of the data collecting connectors 640 in the table 34.

Figure 3:
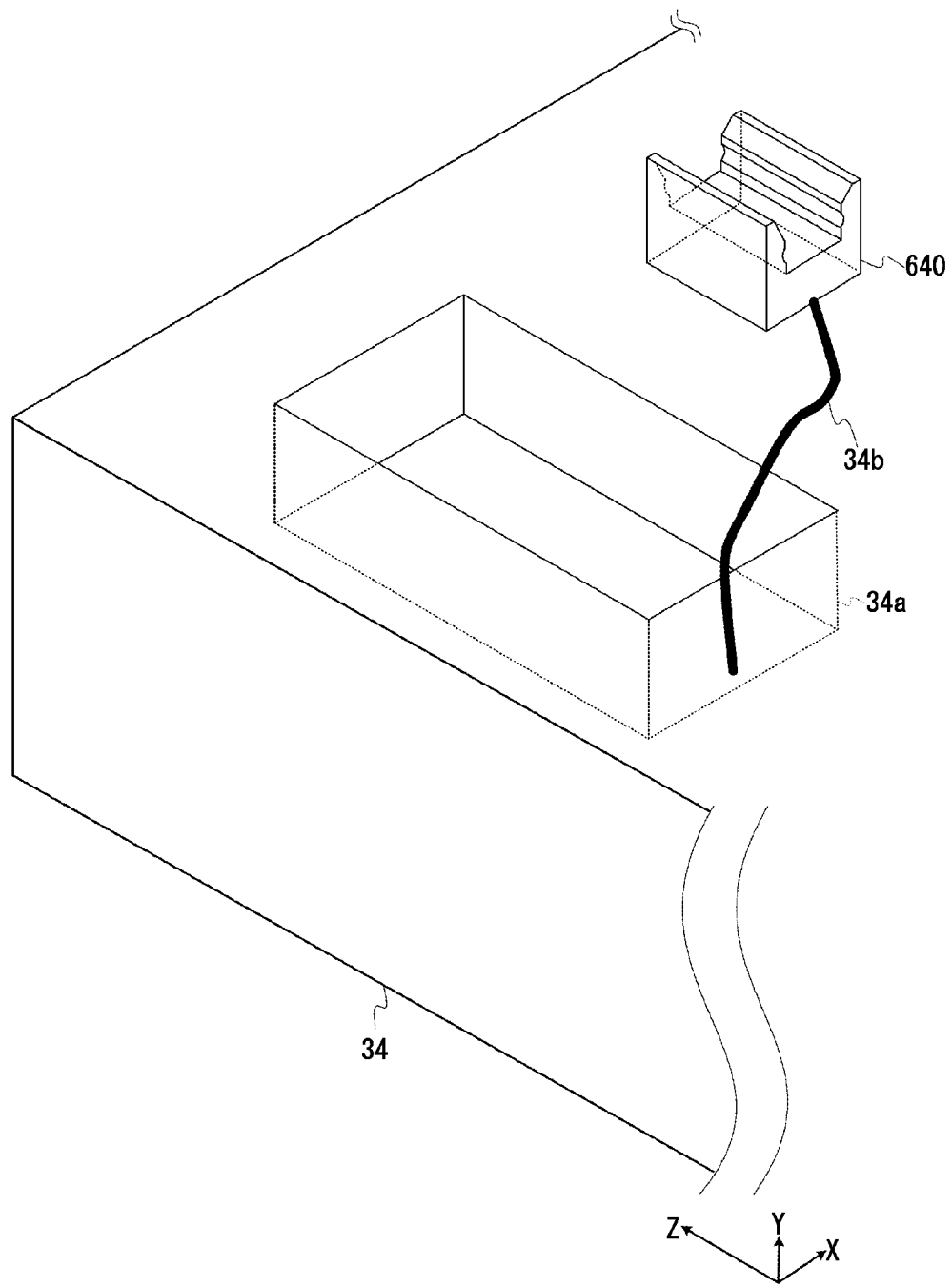
FIG. 3 is an oblique perspective figure in which the part of the storage opening in FIG. 2 is magnified.

FIG. 3 is an oblique perspective figure in which the part of a storage opening 34a in FIG. 2 is magnified. As shown in FIG. 2 and FIG. 3, eight storage openings 34a (for example, holes in the form of a rectangular parallelopiped) are formed on the top surface of the table 34. From the bottom surface of each of the storage openings 34a, a cable 34b is exposed.

One end side of each of the cables 34b is electrically connected to (the RF receiver 48 of) the image reconstruction unit 56 side via hard-wiring inside the table 34. On the other hand, the other end side of each of the cables 34b is electrically connected to each of the data collecting connectors 640.

Thereby, each of the data collecting connectors 640 can be installed on the top surface of the table as shown in FIG. 3, for example, and can be installed on the bottom surface of the storage opening 34a as shown in FIG. 2. That is, the installation position of each of the data collecting connectors 640 can be changed within the length of the cable 34b.

In the example of FIG. 2, eight of the data collecting connectors 640 are disposed on the top surface side of the table 34. That is, on both end sides in the width direction of the table 34, four of the data collecting connectors 640 are respectively arranged along the longer direction of the table 34 (the Z axis direction) in a row at intervals in this example.

Note that, because a plurality of the data collecting connectors 640 are disposed, an RF coil device has only to be connected with any one of the data collecting connectors 640. Thus, the length of each of the cables 34b does not need to be approximately as long as the interval between two mutually adjacent storage openings 34a. The length of each of the cables 34b is preferably equal to or shorter than the half of the interval between two mutually adjacent storage openings 34a so that each of the cables 34b can be stored in each of the storage openings 34a, for example. More specifically the length of each of the cables 34b can be 5 cm, 10 cm, or 15 cm, for example.

Figure 4:
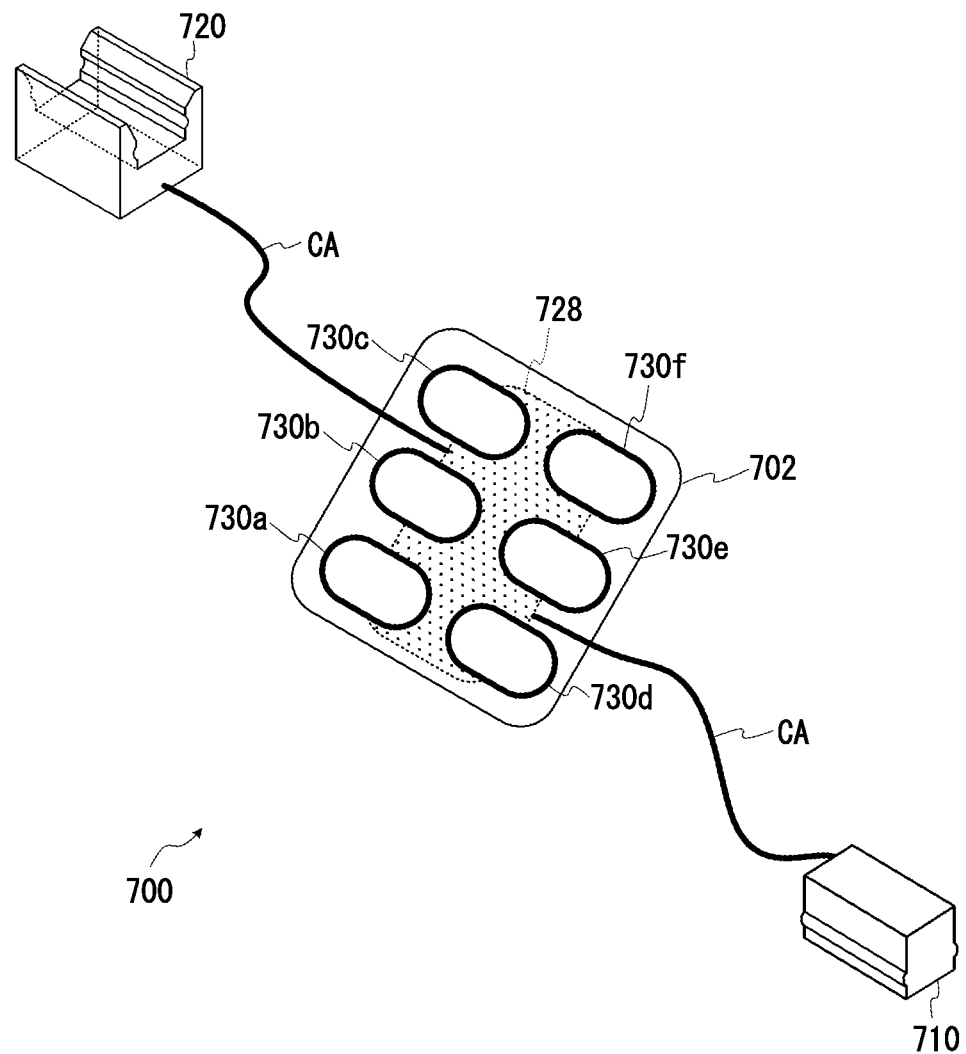
FIG. 4 is an outline view showing an example of the structure of the chest part RF coil device in the present embodiment.

FIG. 4 is an outline view showing an example of the structure of the chest part RF coil device 700 in the present embodiment. As shown in FIG. 4, the chest part RF coil device 700 includes a cover member 702, two the cables CA, a data transmitting connector 710 and an other-coil connecting connector 720.

The cover member 702 is made of a flexible material and is capable of deformation such as folding. As such a deformable (flexible) material, for example, a flexible circuit board (Flexible Printed Circuit: FPC) described in Japanese Patent Application Laid-open (KOKAI) Publication No. 2007-229004 can be used.

Inside the cover member 702, a control unit (control circuit) 728 and coil elements 730a, 730b, 730c, 730d, 730e and 730f are disposed. Although other components such as A/D (analog to digital) convertors ADC are included in the cover member 702, their details will be explained later with FIG. 6 to FIG. 8.

Each of the coil elements 730a to 730f function as antennas which respectively detect MR signals from the object P. Although six coil elements 730a to 730f are shown in FIG. 4 as an example here, the number or shape of the coil elements are not limited to the shown number or shape.

One of the cables CA connects the data transmitting connector 710 to the control unit 728, whereas the other of the cables CA connects the other-coil connecting connector 720 to the control unit 728.

The data transmitting connector 710 wirelessly transmits the MR signals detected by the respective coil elements 730a to 730f to the other-coil connecting connector of another RF coil device or the data collecting connector 640 via an induced electric field.

The other-coil connecting connector 720 is disposed to mutually connect two RF coil devices in series. Therefore, when the chest part RF coil device 700 is solely connected to the data collecting connector 640, the other-coil connecting connector 720 is not used. For the same reason, when the chest part RF coil device 700 is connected to the endmost side from the data collecting connector 640 in serial connection of a plurality of RF coil devices, the other-coil connecting connector 720 of the chest part RF coil device 700 is not used.

The other-coil connecting connector 720 receives MR signals wirelessly transmitted from another RF coil device via an induced electric field, and transmits the received MR signals to the data transmitting connector 710. In this case, the data transmitting connector 710 wirelessly transmits the MR signals obtained by the other-coil connecting connector 720 in addition to the MR signals detected by each of the coil elements 730a to 730f.

Because the structure of each of the pelvic part RF coil device 800 and the lower limb RF coil device 900 is the same as the chest part RF coil device 700 except the number of coil elements, arrangement of coil elements and shape of coil elements, their outline views are omitted.

That is, the pelvic part RF coil device 800 and the lower limb RF coil device 900 respectively include the data transmitting connectors 810 and 910 whose structures are the same as the data transmitting connector 710. In addition, the pelvic part RF coil device 800 and the lower limb RF coil device 900 respectively include the other-coil connecting connectors 820 and 920 whose structures are the same as the other-coil connecting connector 720.

Thus, the connection order of these RF coil devices is in no particular order. For example, these RF coil devices may be connected in series in the order of the lower limb RF coil device 900 to the pelvic part RF coil device 800 to the chest part RF coil device 700, from the data collecting connector 640 side, and the MR signals detected by these three RF coil device may be transmitted from the lower limb RF coil device 900 to the data collecting connector 640.

In the present embodiment, an example in which these RF coil devices are connected in series in the order of the chest part RF coil device 700 to the pelvic part RF coil device 800 to the lower limb RF coil device 900 from the data collecting connector 640 side will be explained.

Figure 5:
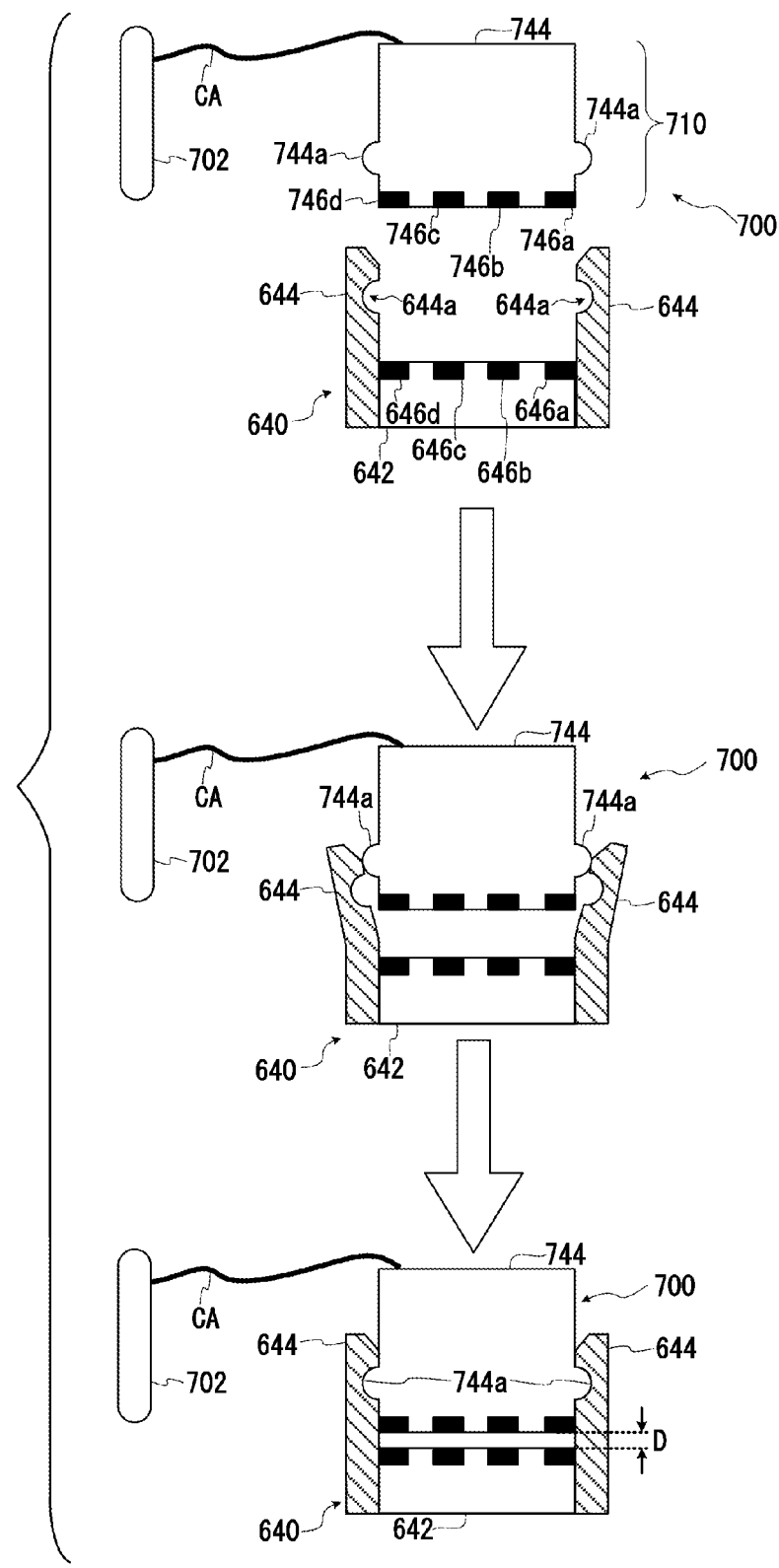
FIG. 5 is a schematic cross-sectional diagram showing an example of methods of fixing the data transmitting connector of the chest part RF coil device to the data collecting connector.

FIG. 5 is a schematic cross-sectional diagram showing an example of methods of fixing the data transmitting connector 710 of the chest part RF coil device 700 to the data collecting connector 640. As shown in the upper part of FIG. 5, two bumps 744a are formed on the chassis 744 of the data transmitting connector 710, for example.

In order to facilitate insertion and detachment of the data transmitting connector 710, each bump 744a is shaped in such a manner that its transverse section becomes a semicircle, for example. This is because smoothly chamfered surfaces of the bumps 744a make it easier to insert the data transmitting connector 710 than bumpy surfaces thereof, in general. The bumps 744a may be spherical, for example. Alternatively, the bumps 744a may be spherical or in the form of a bisected cylinder divided along its axis direction.

As an example here, the chassis 744 which includes the bumps 744a is assumed to be made of undeformable nonmagnetic material. By forming it with nonmagnetic material, influence on the radio communication via an induced electric field can be unfailingly avoided.

As shown in the upper part of FIG. 5, the data collecting connector 640 includes two fixing plates 644 (the shadow area in the upper part of FIG. 5) fixed to ambilateral side surfaces of the chassis 642 by, for example, adhesive bonding.

Both fixing plates 644 are approximately in the form of a flat plate, for example, and disposed so as to face each other. As shown in the lower part of FIG. 5, each of the fixing plates 644 is shaped in the form of interdigitating the data transmitting connector 710. That is, dent parts 644a in the form of interdigitating the bump 744a are respectively chamfered on the mutually facing surfaces of the two fixing plates 644 at a position corresponding to each of the bumps 744a (see the upper part of FIG. 5).

In addition, the end side (the side opposite to the chassis 642) of each of the fixing plates 644 is chamfered aslant in order to ease insertion of the data transmitting connector 710. As to the fixing plates 644, it is preferable to form them with elastic material of nonmagnetic body which can be curved to a degree shown in the middle part of FIG. 5. As such material, for example, plastic and synthetic resin can be used. The reason for forming them with nonmagnetic material is the same as before.

In the above structure, the data transmitting connector 710 is inserted into the data collecting connector 640 from the state of the upper part of FIG. 5. At this insertion timing, as shown in the middle part of FIG. 5, each of the fixing plates 644 is bent in the direction of mutually separating. This is because the maximum width between both bumps 744a on the ambilateral side surfaces of the data transmitting connector 710 is larger than the minimum width between both fixing plates 644.

Then, at the position where the distance between the basal plane of the chassis 744 of the data transmitting connector 710 and the top surface of the chassis 642 of the data collecting connector 640 becomes an interval D, both bumps 744a are respectively interdigitated with the dent parts 644a of the fixing plates 644, and each of the fixing plates 644 returns to the original shape (shown in the upper part of FIG. 5 before insertion) by shape recovery force. Thereby, the data transmitting connector 710 is detachably fixed to the data collecting connector 640 as shown in the bottom part of FIG. 5.

As shown in the upper part of FIG. 5, the data transmitting connector 710 includes antennas 746a 746b, 746c and 746d on its bottom aspect side (the side of the data collecting connector 640 in the above fixed state). In addition, the data collecting connector 640 includes antennas 646a 646b, 646c and 646d on its top surface side (the side of the data transmitting connector 710 in the above fixed state).

Each of the antennas 646a to 646d corresponds to each of the above antennas 746a to 746d so as to group into a pair (totally, four pairs). Out of the antennas 646a to 646d and 746a to 746d, at least the antennas 646a and 746a are composed of, for example, later-described induced electric field combined couplers.

Under the state in which the data transmitting connector 710 and the data collecting connector 640 are closely fixed to each other as just described, the antennas 746a to 746d are disposed at positions where they respectively face the antennas 646a to 646d with the interval D in between. The interval D is an interval capable of the radio communication via an induced electric field. When imaging is finished, the data transmitting connector 710 is taken out of the fixing plates 644 so as to separate from the table 34.

Note that, the above interdigitation is only an example of methods of fixing the data transmitting connector 710, and other detachable fixing methods may be alternatively used. For example, out of the male side and the female side of a hook-and-loop fastener, one side may be fixed to the top surface of the data collecting connector 640 and the other side may be fixed to the bottom surface of the data transmitting connector 710.

The radio communication via an induced electric field is performed on the pathway between the data transmitting connector 710 and the data collecting connector 640. An induced electric field means an electric field caused by time change of magnetic flux density. As short-distance radio communication via an induced electric field, for example, TransferJet (Trademark) which uses an induced electric field combined coupler as an antenna can be used (see Japanese Patent Application Laid-open (KOKAI) Publication No. 2010-147922, for example).

More specifically, the induced electric field combined coupler includes a coupling electrode, a resonance stub, a ground and so on (not shown). If an electric signal is inputted to the resonance stub of the transmission side, electric charges are accumulated in the coupling electrode, and virtual electric charges equal to the electric charges accumulated in the coupling electrode are generated in the ground. Thereby, a micro electrical dipole is composed by these electric charges, and this micro electrical dipole functions as a transmission side antenna.

That is, data are transmitted to the receiving side via an induced electric field of a longitudinal wave generated by the micro electrical dipole. Because a longitudinal wave vibrating in parallel with the traveling direction is not influenced by the direction of an antenna, stable data transmission can be achieved.

However, if the receiving side is separated from the transmission side beyond limit, both sides are not electromagnetically coupled and data transmission cannot be performed. This is because induced electric fields formed by the induced electric field combined couplers rapidly attenuate if the interval between both sides of the couplers becomes distant.

Although the antennas 646a to 646d are discretely disposed and the antennas 746a to 746d are discretely disposed in order to distinguish respective components in FIG. 5, interference between each of the four radio communication pathways can be avoided without arranging them separately. More specifically, the four radio frequencies respectively used in the pathway of the antennas 646a to 746a, the pathway of the antennas 646b to 746b, the pathway of the antennas 646c to 746c and the pathway of the antennas 646d to 746d may be separated (their frequency values may be widely set apart). As to the radio communication frequency, it is preferable to avoid frequencies which are equal to numbers obtained by dividing a center frequency of RF pulses transmitted to the object P by a natural number, in each of the radio communication.

Note that, as long as an electric dipole (antenna) of the data transmitting connector 710 side is not directly contacted to an electric dipole (antenna) of the data collecting connector 640 side, the chassis 744 of the data transmitting connector 710 may be contacted to the chassis 642 of the data collecting connector 640. This is because it is enough if an interval causing an induced electric field is kept between the antennas of the transmission side and the antennas of the receiving side.

In addition, because the other-coil connecting connector 720 of the chest part RF coil device 700 has the same shape as the above data collecting connector 640, it can be interdigitated with each of the data transmitting connectors 810 and 910 of the pelvic part RF coil device 800 and the lower limb RF coil device 900.

Figure 6:
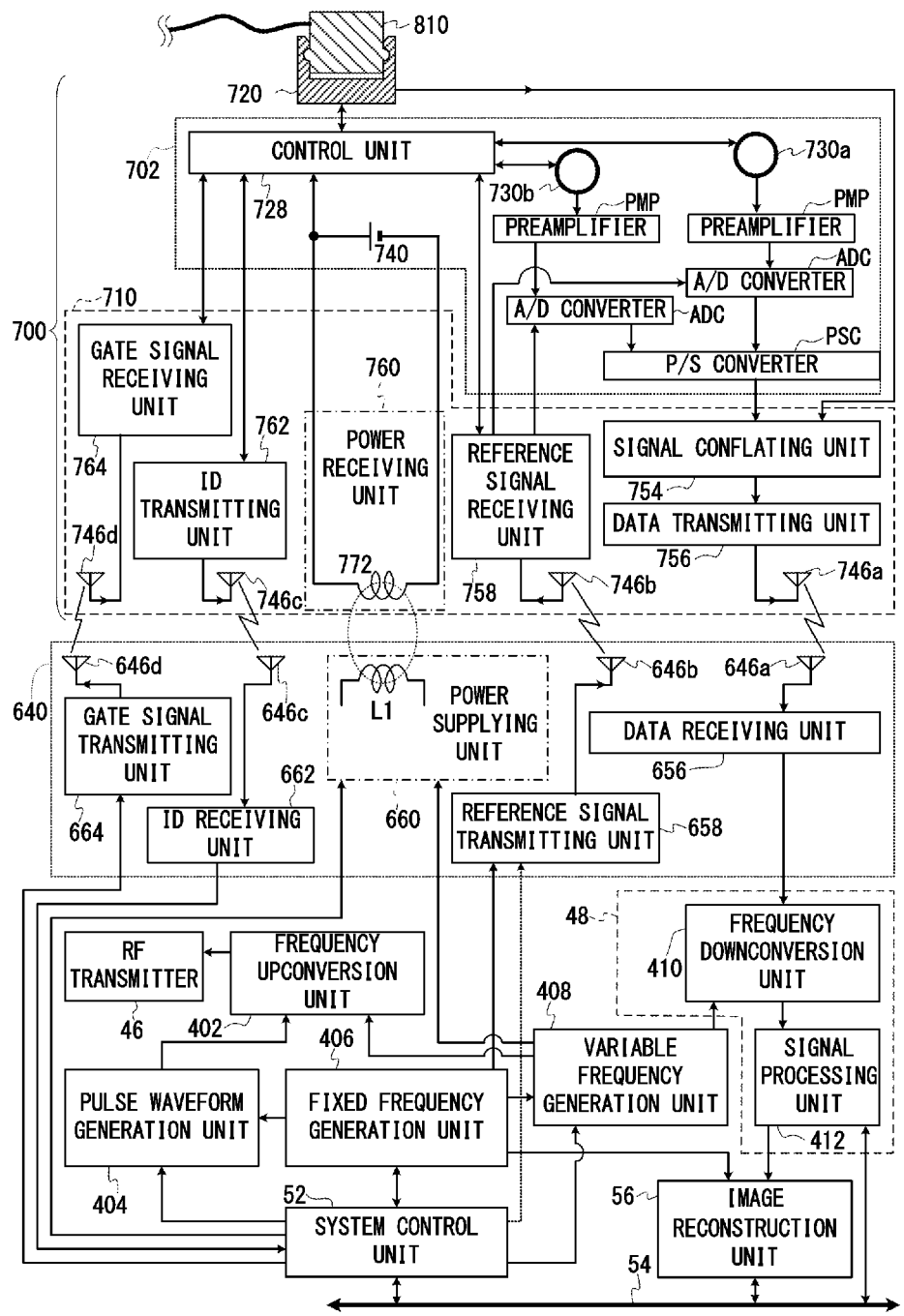
FIG. 6 is a schematic block diagram showing an example of the radio communication between the chest part RF coil device and the control side of the apparatus.

FIG. 6 is a schematic block diagram showing an example of the radio communication between the chest part RF coil device 700 and the control side of the apparatus 20.

Figure 7:
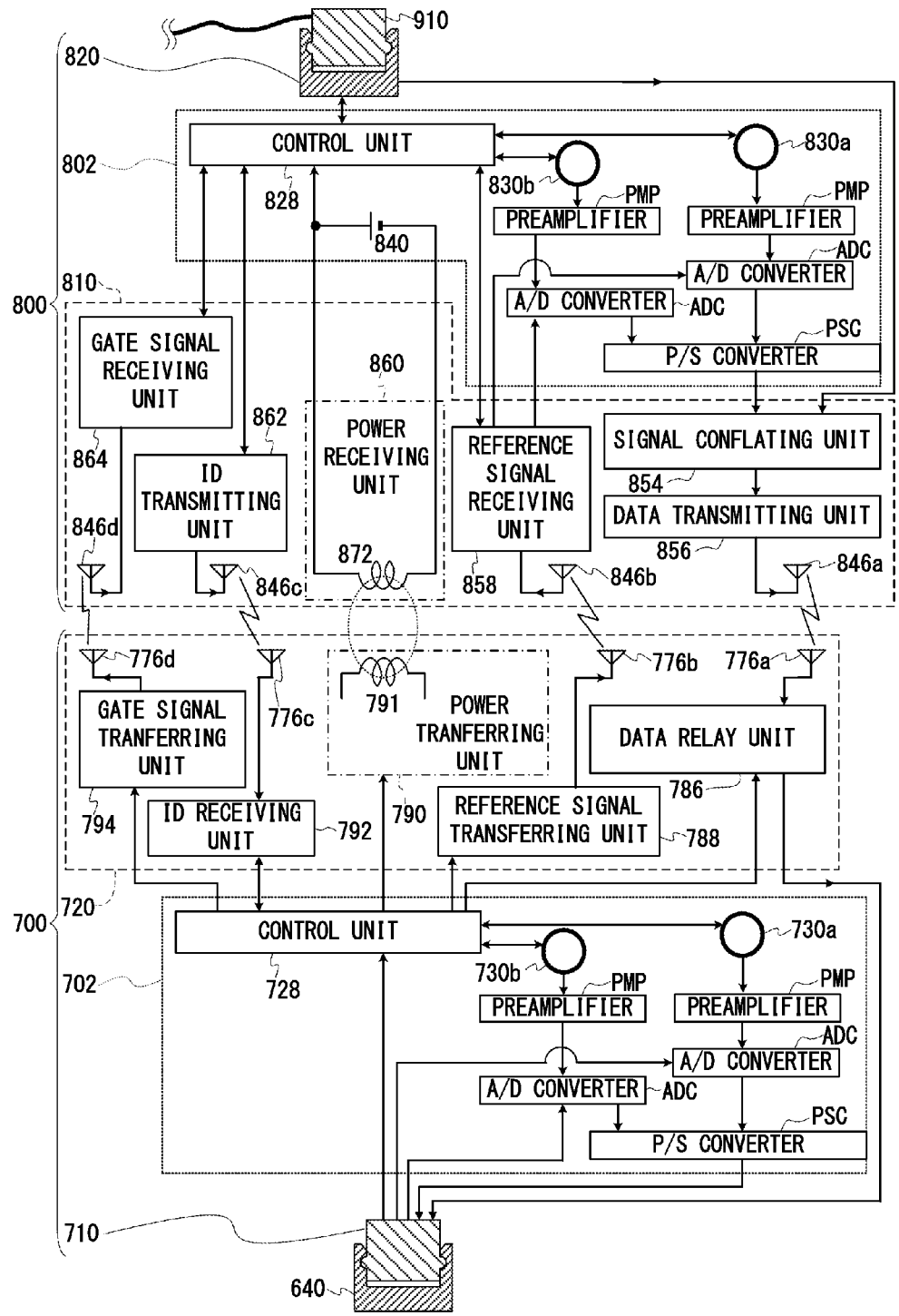
FIG. 7 is a schematic block diagram showing an example of the radio communication between the pelvic part RF coil device and the chest part RF coil device.

FIG. 7 is a schematic block diagram showing an example of the radio communication between the pelvic part RF coil device 800 and the chest part RF coil device 700.

Figure 8:
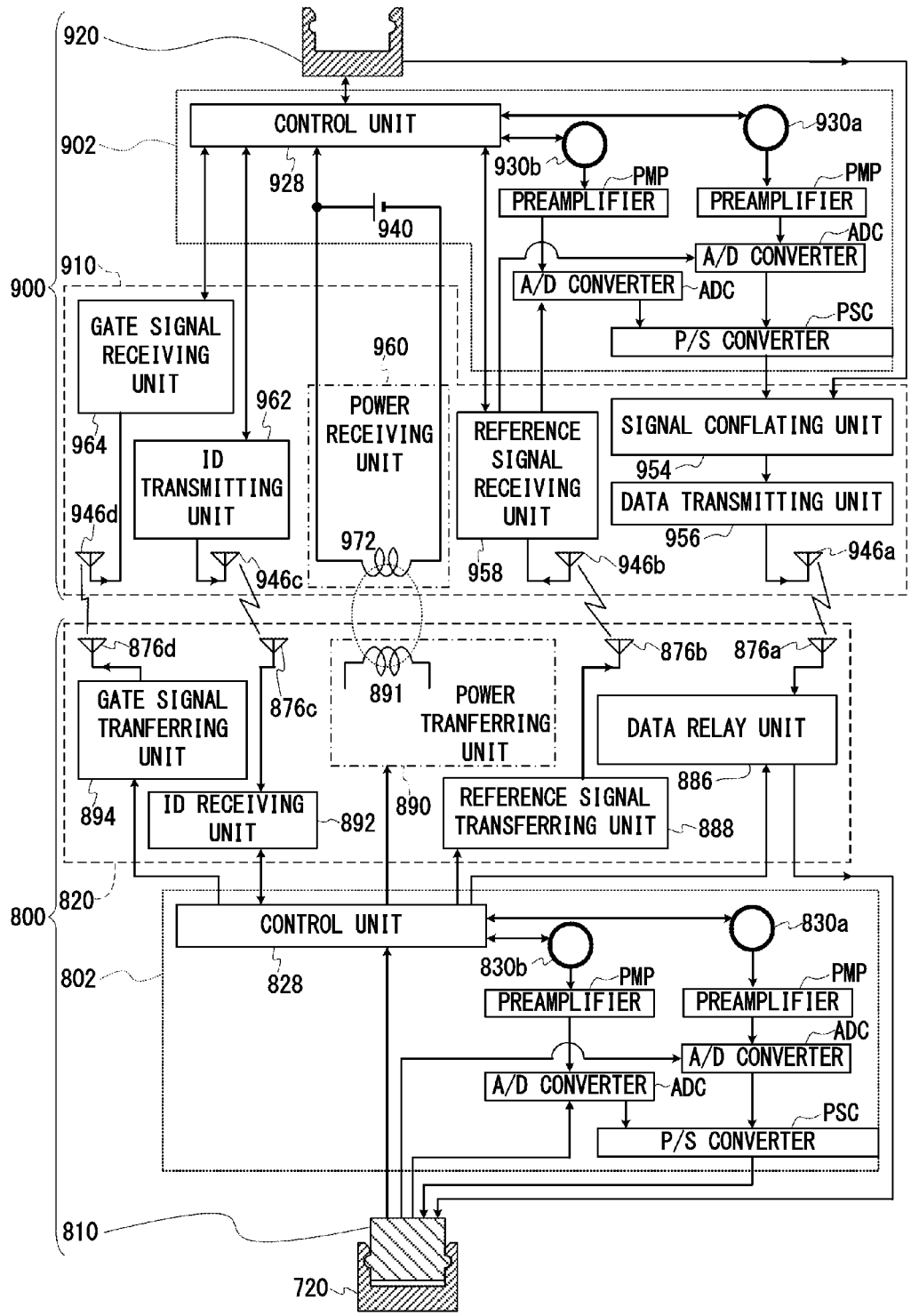
FIG. 8 is a schematic block diagram showing an example of the radio communication between the lower limb RF coil device and the pelvic part RF coil device.

FIG. 8 is a schematic block diagram showing an example of the radio communication between the lower limb RF coil device 900 and the pelvic part RF coil device 800.

In the following, each component of the data collecting connector 640, the chest part RF coil device 700, the pelvic part RF coil device 800, the lower limb RF coil device 900 and the control side of the MRI apparatus will be explained with reference to FIG. 6 to FIG. 8, and then operation of wireless power transmission and four types of radio communication will be explained with reference to FIG. 6 to FIG. 8.

As shown in FIG. 6, inside the cover member 702 of the chest part RF coil device 700, a plurality of preamplifiers PMP respectively corresponding to the coil elements 730a to 730f, A/D converters ADC respectively corresponding to the coil elements 730a to 730f, a P/S (parallel/serial) converter PSC, a rechargeable battery 740 are disposed in addition to the aforementioned components mentioned in FIG. 4.

Note that, the coil elements 730c to 730f are omitted in FIG. 6 for the sake of avoiding complication. In addition, as to the preamplifiers PMP and the A/D converters ADC whose numbers are respectively the same as the coil elements 730a to 730f, two of them are respectively shown in FIG. 6 for the sake of avoiding complication (the same holds true for FIG. 7 and FIG. 8).

Each of the preamplifiers PMP receives the MR signals respectively detected by the coil elements 730a to 730f, amplifies the received MR signals, and inputs the amplified MR signals into the corresponding A/D converters ADC.

Each of the A/D converters ADC digitizes the analogue MR signals inputted from the preamplifiers PMP at the later-described timing, and inputs the digitized MR signals into the P/S converter PSC.

Here, MR signals which are respectively detected by the plurality of coil elements 730a to 730f and respectively subjected to A/D conversion are plural. Therefore, if a plurality of coil elements out of the coil elements 730a to 730f are used for detection of MR signals, the P/S converter PSC converts the inputted plural MR signals from parallel signals into one serial signal for radio transmission.

The data transmitting connector 710 of the chest part RF coil device 700 further includes a signal conflating unit 754, a data transmitting unit 756, a reference signal receiving unit 758, a power receiving unit 760, an ID (Identification Information) transmitting unit 762, a gate signal receiving unit 764, in addition to the aforementioned antennas 746a to 746d. The power receiving unit 760 includes a coil 772.

In FIG. 6, the wiring between the gate signal receiving unit 764 and the control unit 728, the wiring between the coil 772 and the rechargeable battery 740, the wiring between the reference signal receiving unit 758 and each of the A/D converters ADC, and the wiring between the P/S converter PSC and the signal conflating unit 754 are included inside the cable CA (see FIG. 4). For the sake of avoiding complication, the cable CA is omitted in FIG. 6.

The signal conflating unit 754 acquires the MR signal (as a serial signal) transmitted from the other-coil connecting connector 720. In some cases, the MR signal transmitted from the other-coil connecting connector 720 includes only MR signals detected by one RF coil device which is directly connected to the other-coil connecting connector 720. In some cases, the MR signal transmitted from the other-coil connecting connector 720 includes MR signals respectively detected by a plurality of RF coil devices.

The signal conflating unit 754 conflates MR signals inputted from the P/S converter PSC after being detected by the chest part RF coil device 700 and MR signals detected by another RF coil device as mentioned above into one serial signal. For example, if the length of MR signals of the serial signal inputted from the P/S converter PSC of the chest part RF coil device 700 is approximately equal to the length of the MR signals of the serial signal transmitted from the other-coil connecting connector 720, the signal length becomes twofold by conflation (synthesis), for example.

However, if any other RF coil device is not connected to the other-coil connecting connector 720, the signal conflating unit 754 directly inputs the MR signals inputted from the P/S converter PSC into the data transmitting unit 756. As an example here, the other-coil connecting connector 720 is connected to the data transmitting connector 810 of the pelvic part RF coil device 800.

As to the function of the power receiving unit 760, it will be explained later as the operation of wireless power transmission. As to the function of each of the data transmitting unit 756, the reference signal receiving unit 758, the ID transmitting unit 762 and the gate signal receiving unit 764, it will be explained later as the operation of the above four types of radio communication.

In FIG. 6, the data collecting connector 640 further includes a data receiving unit 656, a reference signal transmitting unit 658, a power supplying unit 660, an ID (Identification Information) receiving unit 662 and a gate signal transmitting unit 664, in addition to the aforementioned antennas 646a to 646d. In addition, the power supplying unit 660 includes a coil L1.

As to the function of the power supplying unit 660, it will be explained later as the operation of wireless power transmission. As to the function of each of the data receiving unit 656, the reference signal transmitting unit 658, the ID receiving unit 662 and the gate signal transmitting unit 664, it will be explained later as the operation of the above four types of radio communication.

In FIG. 6, the control system of the MRI apparatus 20 further includes a frequency upconversion unit 402, a pulse waveform generation unit 404, a fixed frequency generation unit 406, a variable frequency generation unit 408, aside from the components shown in FIG. 1. In addition, the RF receiver 48 includes a frequency downconversion unit 410 and a signal processing unit 412.

The fixed frequency generation unit 406 generates the criterion clock signal whose frequency is constant. The fixed frequency generation unit 406 includes a crystal controlled oscillator with high degree of stability and so on, in order to generate the criterion clock signal.

The fixed frequency generation unit 406 inputs the criterion clock signal to the reference signal transmitting unit 658 and the variable frequency generation unit 408. In addition, the fixed frequency generation unit 406 inputs the criterion clock signal to respective components performing clock synchronization inside the MRI apparatus 20 such as the image reconstruction unit 56 and the pulse waveform generation unit 404.

The variable frequency generation unit 408 includes PLL (Phase-Locked Loop), DDS (Direct Digital Synthesizer), and a mixer. The variable frequency generation unit 408 operates on the basis of the above criterion clock signal. The variable frequency generation unit 408 generates a local signal (clock signal) of variable frequency that accords with a setting value inputted from the system control unit 52 as a center frequency of RF pulses.

In order to achieve this, the system control unit 52 inputs a default value of the center frequency of the RF pulses to the variable frequency generation unit 408 before a prescan. In addition, the system control unit 52 inputs a corrected value of the center frequency of the RF pulses to the variable frequency generation unit 408 after the prescan.

The variable frequency generation unit 408 inputs the above local signal of variable frequency to the frequency downconversion unit 410 and the frequency upconversion unit 402.

The system control unit 52 determines the imaging conditions such as a repetition time, a type of RF pulses, a center frequency of the RF pulses and a band width of the RF pulses in a pulse sequence, on the basis of the imaging conditions inputted by a user via the input device 62. The system control unit 52 inputs the imaging conditions determined in the above manner to the pulse waveform generation unit 404.

The pulse waveform generation unit 404 generates a pulse waveform signal of baseband by using the criterion clock signal inputted from the fixed frequency generation unit 406, depending on the imaging conditions inputted from the system control unit 52. The pulse waveform generation unit 404 inputs the pulse waveform signal of baseband to the frequency upconversion unit 402.

The frequency upconversion unit 402 multiplies the pulse waveform signal of baseband by the local signal inputted from the variable frequency generation unit 408, then makes an arbitrary signal band pass by filtering, and thereby performs frequency conversion (upconversion). The frequency upconversion unit 402 inputs the pulse waveform signal of baseband whose frequency is raised to the RF transmitter 46. The RF transmitter 46 generates the RF pulses on the basis of the inputted pulse waveform signal.

Next, as shown in FIG. 7, the other-coil connecting connector 720 of the chest part RF coil device 700 includes antennas 776a, 776b, 776c and 776d, a data relay unit 786, a reference signal transferring unit 788, a power transferring unit 790, an ID receiving unit 792, a gate signal transferring unit 794. The power transferring unit 790 includes a coil 791.

As to the function of the power transferring unit 790, it will be explained later as the operation of wireless power transmission. As to the function of each of the antennas 776a to 776d, the data relay unit 786, the reference signal transferring unit 788, the ID receiving unit 792, the gate signal transferring unit 794, it will be explained later as the operation of the above four types of radio communication.

In FIG. 7, the pelvic part RF coil device 800 includes a data transmitting connector 810, a cover member 802, and the aforementioned other-coil connecting connector 820.

The structure of the data transmitting connector 810 is the same as the data transmitting connector 710 of the chest part RF coil device 700. That is, the data transmitting connector 810 includes antennas 846a, 846b, 846c and 846d, a signal conflating unit 854, a data transmitting unit 856, a reference signal receiving unit 858, a power receiving unit 860, an ID transmitting unit 862 and a gate signal receiving unit 864. As to the symbol of each of these components, only the most significant digit is changed from 7 to 8 for the sake of separating from the data transmitting connector 710.

Inside the cover member 802 of the pelvic part RF coil device 800, a control unit 828, a plurality of coil elements (830a, 830b and so on), a plurality of preamplifiers PMP respectively corresponding to these coil elements, a plurality of A/D converters ADC respectively corresponding to these coil elements, a P/S converter PSC and a rechargeable battery 840 are disposed.

Note that, though only two coil elements inside the cover member 802 are shown in FIG. 7 for the sake of avoiding complication, actually more coil elements are disposed. As to the preamplifiers PMP and the A/D converters ADC, two of them corresponding to the coil elements 830a and 830b are respectively shown (the same holds true for the lower limb RF coil device 900 in FIG. 8).

The other-coil connecting connector 820 is connected to the data transmitting connector 910 of the lower limb RF coil device 900, as an example here.

Next, as shown in FIG. 8, the structure of the other-coil connecting connector 820 of the pelvic part RF coil device 800 is the same as the other-coil connecting connector 720 of the chest part RF coil device 700. That is, the other-coil connecting connector 820 includes antennas 876a, 876b, 876c and 876d, a data relay unit 886, a reference signal transferring unit 888, a power transferring unit 890, an ID receiving unit 892 and a gate signal transferring unit 894. The power transferring unit 890 includes a coil 891. As to the symbol of each of these components, only the most significant digit is changed from 7 to 8 for the sake of separating from the other-coil connecting connector 720.

In FIG. 8, the lower limb RF coil device 900 includes a data transmitting connector 910, a cover member 902 and the aforementioned other-coil connecting connector 920.

The structure of the data transmitting connector 910 is the same as the above data transmitting connectors 710 and 810. That is, the data transmitting connector 910 includes antennas 946a, 946b, 946c and 946d, a signal conflating unit 954, a data transmitting unit 956, a reference signal receiving unit 958, a power receiving unit 960, an ID transmitting unit 962 and the gate signal receiving unit 964. As to the symbol of each of these components, only the most significant digit is changed to 9 for the sake of separating from the data transmitting connectors 710 and 810.

Inside the cover member 902 of the lower limb RF coil device 900, a control unit 928, a plurality of coil elements (930a, 930b and so on), a plurality of preamplifiers PMP respectively corresponding to these coil elements, a plurality of A/D converters ADC respectively corresponding to these coil elements, a P/S converter PSC and a rechargeable battery 940 are disposed.

The structure of the other-coil connecting connector 920 is the same as the above other-coil connecting connectors 720 and 820. As an example here, a further RF coil device is not connected to the other-coil connecting connector 920.

(Operation Explanation of the Present Embodiment)

Next, the operation of wireless power transmission will be explained with reference to FIG. 6 to FIG. 8.

In FIG. 6, consider a case where the coil L1 of the power supplying unit 660 is located in a position close enough to be electro-magnetically coupled to the coil 772 of the power receiving unit 760 (i.e. a case where the data transmitting connector 710 is interdigitated with the data collecting connector 640).

In this case, the power supplying unit 660 supplies a primary current to the coil L1 so as to generate an induced magnetic field, and thereby electromotive force is caused in the coil 772.

The secondary current flowing the coil 772 due to this electromotive force flows in the cover member 702 via the cable CA (not shown in FIG. 7).

Thereby, the rechargeable battery 740 is charged with a part of the secondary current (note that, rectifiers converting alternate current into direct current may be respectively disposed inside the power receiving units 760, 860 and 960, but they are not shown in FIG. 6 to FIG. 8).

The rest of the secondary current flows in the coil 791 of the other-coil connecting connector 720 in FIG. 7 by way of the control unit 728.

Here, as shown in the upper part of FIG. 6, it is assumed that the data transmitting connector 810 of the pelvic part RF coil device 800 is fixed to the other-coil connecting connector 720 of the chest part RF coil device 700. In this case, the coil 791 of the power transferring unit 790 is located within the range close enough to be electro-magnetically coupled to the coil 872 of the power receiving unit 860, in FIG. 7.

Thus, electromotive force is caused in the coil 872 by the induced magnetic field caused by the primary current flowing the coil 791, in the same way as mentioned above. The secondary current flowing the coil 872 due to this electromotive force flows in the cover member 802, and the rechargeable battery 840 is charged with a part of this secondary current. On the other hand, the rest of this secondary current flows in the coil 891 of the other-coil connecting connector 820 in FIG. 8 by way of the control unit 828.

Similarly, as shown in the upper part of FIG. 7, it is assumed that the data transmitting connector 910 of the lower limb RF coil device 900 is fixed to the other-coil connecting connector 820 of the pelvic part RF coil device 800. In this case, the coil 891 of the power transferring unit 890 is located within the range close enough to be electro-magnetically coupled to the coil 972 of the power receiving unit 960, in FIG. 8.

Thus, electromotive force is caused in the coil 972 by the induced magnetic field caused by the primary current flowing the coil 891, in the same way as mentioned above. The secondary current flowing the coil 972 due to this electromotive force flows in the cover member 902, and charges the rechargeable battery 940. Here, because any other RF coil device is not connected to the other-coil connecting connector 920 of the lower limb RF coil device 900, approximately all of the secondary current flowing the coil 972 is allotted to charging of the rechargeable battery 940.

In FIG. 8, the control unit 928 provides the electric power charged in the rechargeable battery 940 in the above manner to each component of the lower limb RF coil device 900 via hard-wiring (not shown). The same holds true for the pelvic part RF coil device 800 and the chest part RF coil device 700.

In addition, as to the frequency of the electric currents flowing the coils L1, 772, 791, 872, 891, 972 in order, it is preferable to separate the frequency from each communication frequency used in the four radio communication pathways. This is so that signals in the four radio communication pathways (1) between the antennas 646a to 646d and the antennas 746a to 746d, (2) between the antennas 776a to 776d and the antennas 846a to 846d, (3) between the antennas 876a to 876d and the antennas 946a to 946d are not interfered by the above primary current and secondary current.

Note that, as an alternative method of saving electric power of the chest part RF coil device 700, the pelvic part RF coil device 800, the lower limb RF coil device 900, the rechargeable batteries 740, 840 and 940 may be charged during unused span of these RF coil devices instead of the above wireless power transmission. Alternatively, rechargeable batteries charged during unused span of these RF coil devices and the above wirelessly charged rechargeable batteries 740, 840 and 940 may be used in combination.

Next, the four radio communication pathways will be explained.

Firstly, in the pathway between the antennas 646c and 746c in FIG. 6, the pathway between the antennas 776c and 846c in FIG. 7, and the pathway between the antennas 876c and 946c in FIG. 8, each identification information of the chest part RF coil device 700, the pelvic part RF coil device 800 and the lower limb RF coil device 900 is transmitted to the data collecting connector 640 side.

This radio communication of the identification information may be performed in the same way as RFID (Radio Frequency Identification) typified by, for example, IC (Integrated Circuit) tag. In addition, the identification information is preliminarily stored in each of the ID transmitting units 762, 862 and 962. However, the identification information may be respectively inputted from the control units 728, 828 and 928 to the ID transmitting units 762, 862 and 962 by wired transmission.

As concrete operation, if the antenna 746c of the ID transmitting unit 762 is placed to a position within the communication range of the antenna 646c of the ID receiving unit 662 by inserting the data transmitting connector 710 into the data collecting connector 640 in FIG. 6, the ID transmitting unit 762 operates by using the electric power wirelessly transmitted from the ID receiving unit 662.

That is, the ID transmitting unit 762 wirelessly transmits the identification information of the chest part RF coil device 700 as a digital signal from the antenna 746c to the antenna 646c, automatically.

The ID receiving unit 662 inputs the identification information of the chest part RF coil device 700 received with the antenna 646c into the system control unit 52. Thereby, the system control unit 52 recognizes that the chest part RF coil device 700 is directly connected to the data collecting connector 640, and inputs communication permission between the chest part RF coil device 700 and the data collecting connector 640 into each component of the control side of the MRI apparatus 20.

The power supplying unit 660 receives the above communication permission, then starts the aforementioned wireless power transmission, and continues this wireless power transmission until the communication permission is stopped. Thereby, in the same way as mentioned above, each of the rechargeable batteries 740, 840 and 940 of the chest part RF coil device 700, the pelvic part RF coil device 800 and the lower limb RF coil device 900 is charged. Because the pelvic part RF coil device 800 and the lower limb RF coil device 900 boot up by this electric power, they get able to transmit their identification information.

More specifically, the system control unit 52 makes the ID receiving unit 662 wirelessly transmit the following information request to the ID transmitting unit 762 after outputting the above communication permission. The information request is as to whether another RF coil device is connected to the chest part RF coil device 700.

At the same time, in FIG. 8, the control unit 928 of the lower limb RF coil device 900 of the endmost side judges that another RF coil device is not connected to the other-coil connecting connector 920, on condition that there is no input signal from the other-coil connecting connector 920, for example.

Therefore, the control unit 928 makes the ID transmitting unit 962 wirelessly transmit the identification information of the lower limb RF coil device 900 and the information indicating that any other RF coil device is not connected to the other-coil connecting connector 920 of the lower limb RF coil device 900. That is, the above information is transmitted to the ID receiving unit 892 of the pelvic part RF coil device 800 by the radio communication between the antenna 876c and antenna 946c.

The ID receiving unit 892 inputs the received information into the control unit 828. Thereby, the control unit 828 makes the ID transmitting unit 862 wirelessly transmit the following three information terms to the ID receiving unit 792 of the chest part RF coil device 700, through the radio communication pathway between the antenna 776c and the antenna 846c.

The above three information terms are (1) information that only the lower limb RF coil device 900 is connected to the other-coil connecting connector 820 of the pelvic part RF coil device 800, (2) the identification information of the lower limb RF coil device 900, and (3) the identification information of the pelvic part RF coil device 800.

The ID receiving unit 792 transmits the above three information terms to the control unit 728. The control unit 728 judges (determines) that three RF coil devices are connected in series in the order of the chest part RF coil device 700 to the pelvic part RF coil device 800 to the lower limb RF coil device 900 from the data collecting connector 640 side, and generates this judgment result as connection information. This connection information includes the identification information of each of the chest part RF coil device 700, the pelvic part RF coil device 800 and the lower limb RF coil device 900.

The control unit 728 makes the ID transmitting unit 762 transmit the above connection information to the ID receiving unit 662 in reply to the above information request, in the radio communication pathway between the antenna 646c and the antenna 746c in FIG. 6. As transmission aspects of the connection information, for example, the above connection information may be indicated by transmitting each identification information of the chest part RF coil device 700, the pelvic part RF coil device 800 and the lower limb RF coil device 900 in order, as a serial signal.

The ID receiving unit 662 inputs the received connection information into the system control unit 52. Thereby, the system control unit 52 recognizes that three RF coil devices are connected in series in the order of the chest part RF coil device 700 to the pelvic part RF coil device 800 to the lower limb RF coil device 900 from the data collecting connector 640 side.

Figure 9:
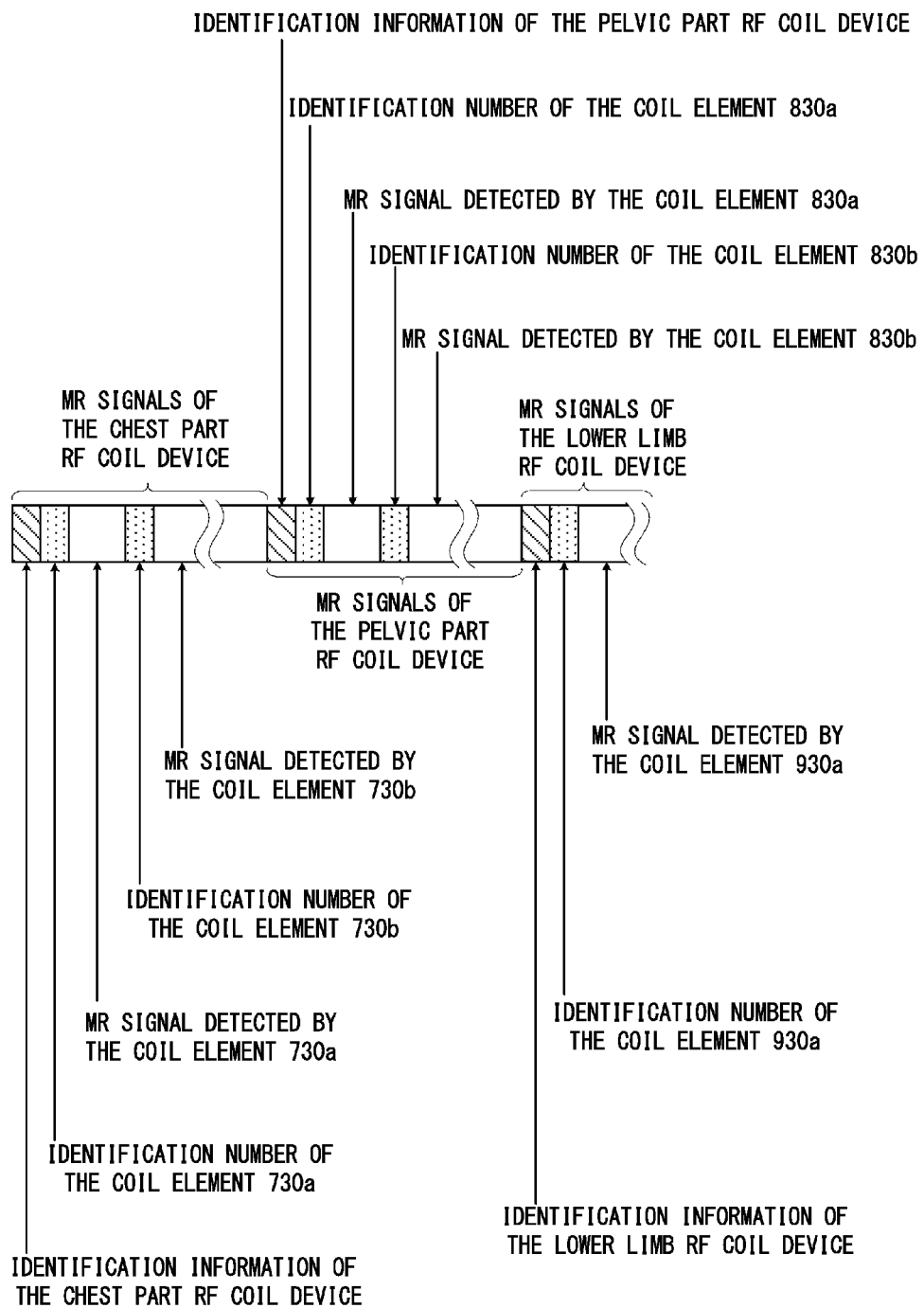
FIG. 9 is an explanatory diagram showing an example of the composition of the serial signal.

Secondly, in the pathway between the antenna 646d and the antenna 746d in FIG. 6, the pathway between the antenna 776d and the antenna 846d in FIG. 7, and the pathway between the antenna 876d and the antenna 946d in FIG. 9, digital gate signals are continuously transmitted during imaging by the radio communication via an induced electric field, for example.

More specifically, as a switch changing on/off state of each coil element of the chest part RF coil device 700, the pelvic part RF coil device 800 and the lower limb RF coil device 900, for example, an active trap circuit including a PIN diode (p-intrinsic-n Diode) and so on are respectively disposed on the coil elements. The gate signal is a control signal of the above switch.

During each period in which an RF pulse is transmitted to the object P, the gate signal inputted to the chest part RF coil device 700, the pelvic part RF coil device 800 and the lower limb RF coil device 900 via the gate signal transmitting unit 664, the antennas 646*d* and 746*d*, the gate signal receiving unit 764 or the like is generally set to on-level. During the on-level span of the gate signal, the above switch becomes off-state so as to disconnect the loop of each coil element (930*a* and so on) and thereby each of the coil elements cannot detect MR signals.

Note that, in the following explanation, all the coil elements of the chest part RF coil device 700, the pelvic part RF coil device 800 and the lower limb RF coil device 900 selected for detecting MR signals is arbitrarily referred to as "each coil element (930*a* and so on)" like the above for the sake of simplifying the explanation.

Except the span during which RF pulses are transmitted to the object P, the gate signal adjusted to off-level is wirelessly transmitted. While the gate signal is off-level, the above switch becomes on-state and each coil element (930*a* and so on) can detect MR signals. Coupling effect between the transmission RF coil 28 which transmits RF pulses to the object P and each coil element (930*a* and so on) which detects the MR signals from the object P is prevented by the above on/off switching of the coil elements (930*a* and so on).

Transmission of gate signals is performed on a real-time basis from the data collecting connector 640 to the lower limb RF coil device 900 of the endmost side. The above "real-time" means to perform a process with a delay time short enough to cause no problem in operation of detecting MR signals, as compared with an application timing and an application period of each RF pulse and each gradient magnetic field pulse in a pulse sequence.

More specifically, first, in the pathway between the antenna 646*d* and the antenna 746*d* in FIG. 6, a gate signal is transmitted from the gate signal transmitting unit 664 of the data collecting connector 640 to the gate signal receiving unit 764 of the chest part RF coil device 700.

Next, the gate signal received by the gate signal receiving unit 764 is inputted to the control unit 728 and transmitted to the pelvic part RF coil device 800 by way of the control unit 728. That is, the gate signal is wirelessly transmitted from the gate signal transferring unit 794 to the gate signal receiving unit 864 in the pathway between the antenna 776*d* and the antenna 846*d* in FIG. 7.

Similarly, the gate signal received by the gate signal receiving unit 864 is inputted to the control unit 828 and transmitted to the lower limb RF coil device 900 by way of the control unit 828. That is, the gate signal is wirelessly transmitted from the gate signal transferring unit 894 to the gate signal receiving unit 964 in the pathway between the antenna 876*d* and the antenna 946*d* in FIG. 8.

Thirdly, in the pathway between the antenna 646*b* and the antenna 746*b* in FIG. 6, the pathway between the antenna 776*b* and the antenna 846*b* in FIG. 7, and the pathway between the antenna 876*b* and the antenna 946*b* in FIG. 8, digital reference signals are continuously transmitted during imaging by the radio communication via an induced electric field, for example.

More specifically, the reference signal is a signal that synchronizes the transmission side of MR signals with a basic frequency of system on the basis of the fixed frequency generation unit 406. Here, the transmission side of MR signals are the chest part RF coil device 700, the pelvic part RF coil device 800 and the lower limb RF coil device 900.

The reference signal transmitting unit 658 generates the reference signal by performing processing such as modulation, frequency conversion, amplification and filtering on the criterion clock signal inputted from the fixed frequency generation unit 406.

In addition, a trigger signal (A/D conversion start signal) that determines timing of sampling in each of the A/D converters ADC in the chest part RF coil device 700, the pelvic part RF coil device 800 and the lower limb RF coil device 900 is inputted from the system control unit 52 to the reference signal transmitting unit 658.

The above sampling means, for example, to extract intensity of an analog signal at regular time intervals so as to enable digital record. As an example here, the reference signal transmitting unit 658 wirelessly transmits both the reference signal and the trigger signal to the reference signal receiving unit 758, by superimposing the trigger signal on the reference signal.

The transmission of the reference signal and the trigger signal is performed on a real-time basis from the data collecting connector 640 to the lower limb RF coil device 900 of the endmost side, in the way similar to the gate signal.

More specifically, first, the reference signal and the trigger signal are wirelessly transmitted from the reference signal transmitting unit 658 of the data collecting connector 640 to the reference signal receiving unit 758 of the chest part RF coil device 700 in the pathway between the antenna 646*b* and the antenna 746*b* in FIG. 6.

Next, the reference signal and the trigger signal received by the reference signal receiving unit 758 are inputted to the respective A/D converters ADC and the control unit 728 of the chest part RF coil device 700, and transmitted to the pelvic part RF coil device 800 by way of the control unit 728. That is, the reference signal and the trigger signal are wirelessly transmitted from the reference signal transferring unit 788 to the reference signal receiving unit 858 in the pathway between the antenna 776*b* and the antenna 846*b* in FIG. 7.

The reference signal and the trigger signal received by the reference signal receiving unit 858 are similarly inputted to the respective A/D converters ADC and the control unit 828 of the pelvic part RF coil device 800, and transmitted to the lower limb RF coil device 900 by way of the control unit 828. That is, the reference signal and the trigger signal are wirelessly transmitted from the reference signal transferring unit 888 to the reference signal receiving unit 958 in the pathway between the antenna 876*b* and the antenna 946*b* in FIG. 8, and inputted to the respective A/D converters ADC and the control unit 928 of the lower limb RF coil device 900.

Fourthly, in the pathway between the antenna 646*a* and the antenna 746*a* in FIG. 6, the pathway between the antenna 776*a* and the antenna 846*a* in FIG. 7, and the pathway between the antenna 876*a* and the antenna 946*a* in FIG. 8, digitized MR signals are continuously transmitted by the radio communication via an induced electric field.

The MR signals detected by each coil element (930*a* and so on) of the chest part RF coil device 700, the pelvic part RF coil device 800 and the lower limb RF coil device 900 are wirelessly transmitted as a serial signal in a time division manner. This is because the antennas for transmitting MR signals is only one pair between each RF coil device in the example of the present embodiment.

As to the flow of wireless transmission of MR signals, it is more intelligible to explain from the lower limb RF coil device 900 of the endmost side. Thus, it will be explained from the lower limb RF coil device 900 side in order, as follows.

Each of the A/D converters ADC of the lower limb RF coil device 900 starts sampling and quantization of MR signals on the basis of the reference signal (sampling clock signal), in synchronization with the timing when the trigger signal is transmitted. The respective A/D converters ADC input the digitized MR signals into the P/S converter PSC.

The P/S converter PSC converts the plurality of MR signals from parallel signals into a serial signal. As an example in the present embodiment, the serial signal includes the identification information of the corresponding RF coil device and an identification number of the corresponding coil element, so that the serial signal can be separated into MR signals of each coil element in the rear stage.

Thus, a serial signal is composed, for example, in the order of early transmission time. For example, it is composed of, first, the identification information of the lower limb RF coil device 900, then the identification number of a coil element such as 930*a*, then MR signals detected by this coil element, then the identification number of another coil element . . . (see later described FIG. 9).

The P/S converter PSC inputs the generated serial signal into the signal conflating unit 954.

The same processing as the above processing performed by the respective A/D converters ADC and the P/S converter PSC holds true for the chest part RF coil device 700 and the pelvic part RF coil device 800.

Here, because any other RF coil device is not connected to the other-coil connecting connector 920 of the lower limb RF coil device 900 in FIG. 8, only MR signals as one serial signal are inputted from the P/S converter PSC to the signal conflating unit 954. Thus, the signal conflating unit 954 directly inputs the inputted serial signal into the data transmitting unit 956 (without change).

The data transmitting unit 956 generates MR signals for radio transmission (which are serial signals and digital signals) by performing processing such as error correction encoding, interleave, modulation, frequency conversion, amplification, and filtering on the inputted serial signal (of MR signals).

Then, the above MR signals are wirelessly transmitted from the data transmitting unit 956 to the data relay unit 886 of the pelvic part RF coil device 800 in the pathway between the antenna 876*a* and the antenna 946*a* in FIG. 8.

Inside the pelvic part RF coil device 800, the data relay unit 886 inputs the MR signals received in the above manner to the signal conflating unit 854 in FIG. 7. Here, MR signals digitized inside the pelvic part RF coil device 800 after being detected by each coil element (830*a*, 830*b* and so on) are also inputted to the signal conflating unit 854 as a serial signal.

The signal conflating unit 854 conflates one serial signal (which are originally the MR signals detected in the lower limb RF coil device 900) inputted from the data relay unit 886 and another serial signal (which are originally the MR signals detected in the pelvic part RF coil device 800) inputted from the P/S converter PSC into one serial signal.

This serial signal also includes the identification information of the respective RF coil devices and an identification number of each coil element, so that it can be separated into MR signals of each coil element in the rear stage (see later-described FIG. 9).

The signal conflating unit 854 inputs the generated serial signal into the data transmitting unit 856. Then, in the way similar to above, this serial signal is wirelessly transmitted from the data transmitting unit 856 to the data relay unit 786 of the chest part RF coil device 700 in the pathway between the antenna 776*a* and the antenna 846*a* in FIG. 7.

Inside the chest part RF coil device 700, the data relay unit 786 inputs the serial signal received in the above manner into the signal conflating unit 754 in FIG. 6. Here, MR signals digitized inside the chest part RF coil device 700 after being detected by each coil element (730*a*, 730*b* and so on) are also inputted to the signal conflating unit 754 as a serial signal.

The signal conflating unit 754 conflates one serial signal (which are originally the MR signals detected in the lower limb RF coil device 900 and the pelvic part RF coil device) inputted from the data relay unit 786 and another serial signal (which are originally the MR signals detected in the chest part RF coil device 700) inputted from the P/S converter PSC into one serial signal, in such a manner that the conflated serial signal can be separated into an MR signal of each coil element in the rear stage.

The signal conflating unit 754 inputs the generated serial signal into the data transmitting unit 756. Then, in the way similar to above, this serial signal is wirelessly transmitted from the data transmitting unit 756 to the data receiving unit 656 of the data collecting connector 640 in the pathway between the antenna 646*a* and the antenna 746*a* in FIG. 6.

The foregoing is an explanation of the four radio communication pathways.

FIG. 9 is an explanatory diagram showing an example of the composition of the above serial signal. The serial signal is composed in such a manner that it can be separated into MR signals of each RF coil device and it can be separated into MR signals of each coil element.

In the example of FIG. 9, the serial signal is composed in the order of (1) MR signals detected by the chest part RF coil device 700 to (2) MR signals detected by the pelvic part RF coil device 800 to (3) MR signals detected by the lower limb RF coil device 900, from the head. That is, each of the signal conflating units 754 and 854 generates one new serial signal by connecting the head of the serial signal inputted from the other-coil connecting connectors 720, 820 to the endmost part of the serial signal inputted from the P/S converter PSC, in principle.

The part of the MR signals detected by the chest part RF coil device 700 in the serial signal in FIG. 9 is composed as follows. For example. The identification information of the chest part RF coil device 700 is putted to its head, and then MR signals per coil elements succeed the head. As to MR signals per coil elements, the identification number (such as 730*a*) of a coil element is added on its beginning, and then digital data of MR signals detected by the coil element whose identification number is written just before. The same hold true for the part of MR signals detected by the pelvic part RF coil device 800 and the part of MR signals detected by the lower limb RF coil device 900 (in the serial signal in FIG. 9).

Figure 10:
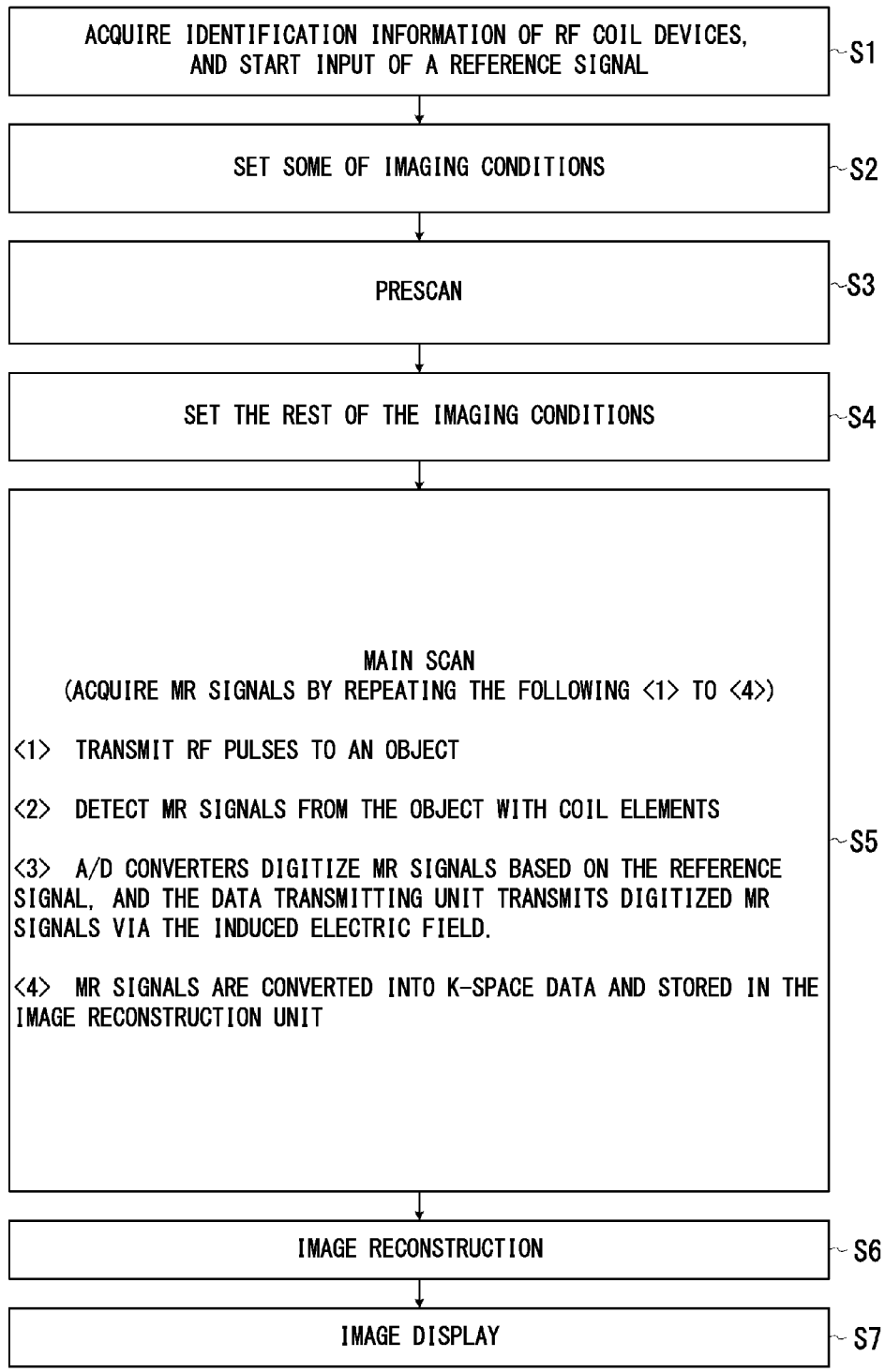
FIG. 10 is a flowchart illustrating an example of the flow of the imaging operation performed by the MRI apparatus of the present embodiment.

FIG. 10 is a flowchart illustrating an example of the flow of the imaging operation performed by the MRI apparatus 20 of the present embodiment.

In the following, according to the step numbers in the flowchart shown in FIG. 10, the imaging operation of the MRI apparatus 20 will be described by referring to the aforementioned FIG. 1 to FIG. 9 as required.

[Step S1] Under the state in which the table 34 (see FIG. 1) is outside the gantry 21, the chest part RF coil device 700, the pelvic part RF coil device 800 and the lower limb RF coil device 900 are respectively loaded on the object P on the table 34.

In addition, the data transmitting connector 710 of the chest part RF coil device 700 is detachably fixed to the nearest data collecting connector 640, for example (see FIG. 2 to FIG. 5).

In addition, the data transmitting connector 810 is similarly fixed to the other-coil connecting connector 720 (see FIG. 6), and the data transmitting connector 910 is similarly fixed to the other-coil connecting connector 820 (see FIG. 7).

If the data transmitting connector 710 and the data collecting connector 640 fall within the range capable of mutual communication by the above short-distance fixation, the identification information of the chest part RF coil device 700 is inputted to the system control unit 52 by the aforementioned communication and the communication permission is outputted.

Thereby, as explained with FIG. 6 to FIG. 8, the wireless power transmission is started to the chest part RF coil device 700, the pelvic part RF coil device 800 and the endmost lower limb RF coil device 900, and the connection information of these three RF coil devices is inputted to the system control unit 52.

In addition, the reference signal transmitting unit 658 starts inputting the reference signal to each of the reference signal receiving units 758, 858 and 958 in the way explained with FIG. 6 to FIG. 8, in accordance with the communication permission outputted by the system control unit 52 (the reference signal is continuously wirelessly transmitted). Note that, the trigger signal is superimposed on the transmitted reference signal.

After this, the table driving device 50 (see FIG. 1) moves the table 34 to inside of the gantry in accordance with the control of the system control unit 52.

After this, the process proceeds to Step S2.

[Step S2] The system control unit 52 sets some of the imaging conditions of the main scan on the basis of the imaging conditions inputted to the MRI apparatus 20 via the input device 62 and the connection information on the RF coil devices acquired in Step S1.

After this, the process proceeds to Step S3.

[Step S3] The system control unit 52 makes the MRI apparatus 20 perform prescans by controlling each component of the MRI apparatus 20. In the prescans, for example, imaging conditions such as a corrected value of the center frequency of the RF pulses is calculated.

After this, the process proceeds to Step S4.

[Step S4] The system control unit 52 sets the rest of the imaging conditions on the basis of the execution results of the prescans. The imaging conditions include information on which of the coil elements (930*a* and so on) are used for detecting MR signals in the main scan.

Thus, the system control unit 52 inputs the information on the coil elements used for the main scan into each of the control units 728, 828, 928 of the chest part RF coil device 700, the pelvic part RF coil device 800 and the lower limb RF coil device 900 via any one of the radio communication pathways.

The information on the coil elements used for detection in the main scan is, for example, wirelessly transmitted from the gate signal transmitting unit 664 to each of the control units 728, 828, 928 via the pathway between the antenna 646*d* and the antenna 746*d* in FIG. 6, the pathway between the antenna 776*d* and the antenna 846*d* in FIG. 7 and the pathway between the antenna 876*d* and the antenna 946*d* in FIG. 8, for example.

After this, the process proceeds to Step S5.

[Step S5] The system control unit 52 makes the MRI apparatus 20 perform the main scan by controlling each component thereof.

More specifically, a static magnetic field is formed in the imaging space by the static magnetic field magnet 22 excited by the static magnetic field power supply 40. In addition, electric currents are supplied from the shim coil power supply 42 to the shim coil 24, and thereby the static magnetic field formed in the imaging space is uniformed.

Note that, during the implementation term of the main scan, the aforementioned gate signal from the gate signal transmitting unit 664 is continuously wirelessly transmitted to the chest part RF coil device 700, the pelvic part RF coil device 800 and the lower limb RF coil device 900, by the operation explained with FIG. 6 to FIG. 8

After this, when the start command is inputted into the system control unit 52 from the input device 62, the MR signals from the object P are acquired (collected) by repeating the following processes of <1> to <4> in series.

<1> The system control unit 52 drives the gradient magnetic field power supply 44, the RF transmitter 46 and the RF receiver 48 in accordance with the pulse sequence, thereby the gradient magnetic fields are formed in the imaging region including the imaging part of the object P, and the RF pulses are transmitted from the transmission RF coil 28 to the object P.

Only during the transmission period of the RF pulses, the gate signal is adjusted to, for example, on-level and each coil element (930*a* and so on) of the chest part RF coil device 700, the pelvic part RF coil device 800 and the lower limb RF coil device 900 is set to off-state so as to prevent the coupling effect.

<2> Each of the gate signals is switched over to, for example, off-level after transmission of the RF pulses, and each coil element (930*a* and so on) detects the MR signals caused by nuclear magnetic resonance inside the object P.

Each of the detected analog MR signals is inputted from each coil element (930*a* and so on) to the corresponding the preamplifier PMP. Each of the preamplifiers PMP amplifies the inputted MR signal and then inputs the amplified MR signal to the corresponding A/D converter 212.

Here, both the preamplifiers PMP and the A/D converters ADC corresponding to the coil elements which are not selected in Step S4 for detection of MR signals do not operate. Thus, only the MR signals of the coil elements selected in Step S4 for detection of MR signals are transmitted to the rear stage.

<3> Each of the A/D converters ADC corresponding to each coil element (930 and so on) selected for detection starts sampling and quantization of the MR signals on the basis of the reference signal, in synchronization with the timing when the trigger signal is wirelessly transmitted. Each of the A/D converters ADC inputs the digitized MR signals to the P/S converter PSC, respectively.

Each of the P/S converters PSC converts the inputted plural MR signals as parallel signals into a serial signal, and inputs the generated serial signal to each of the signal conflating units 754, 854 and 954.

After this, as explained with FIG. 6 to FIG. 8, the MR signals respectively detected by the chest part RF coil device 700, the pelvic part RF coil device 800 and the lower limb RF coil device 900 are finally conflated into one serial signal (see FIG. 9), and wirelessly transmitted to the data receiving unit 656 (via an induced electric field).

<4> The data receiving units 656 performs processing such as amplification, frequency conversion, demodulation, deinterleave and error correction decoding on the serial MR signals received by the antennas 646a. Thereby, the data receiving unit 656 extracts the original digitized MR signals from the MR signals for radio transmission.

That is, the data receiving unit 656 extracts MR signals separately for each coil element of each of the chest part RF coil device 700, the pelvic part RF coil device 800 and the lower limb RF coil device 900. The data receiving unit 656 inputs each of the extracted MR signals to the frequency downconversion unit 410 of the RF receiver 48.

The frequency downconversion unit 410 multiplies the MR signals inputted from the data receiving unit 656 by the local signal inputted from the variable frequency generation unit 408, and makes only an arbitrary signal band get through by filtering. Thereby, the frequency downconversion unit 410 performs frequency conversion (downconversion) on the MR signals, and inputs the MR signals whose frequency is lowered to the signal processing unit 412.

The signal processing unit 412 generates raw data of the MR signals by performing predetermined signal processing on the above MR signals, and inputs the raw data of the MR signals to the image reconstruction unit 56. The image reconstruction unit 56 converts the raw data of the MR signals into, for example, matrix data, and stores the converted data as k-space data.

After completion of acquisition of the MR signals by repeating the above <1> to <4> processes, the process proceeds to Step S6.

[Step S6] The image reconstruction unit 56 reconstructs image data by performing image reconstruction processing including Fourier transformation on the k-space data, and stores the reconstructed image data in the image database 58 (see FIG. 1).

After this, the process proceeds to Step S7.

[Step S7] The image processing unit 60 obtains the image data from the image database 58 and generates display image data by performing predetermined image processing on the obtained image data. The image processing unit 60 stores the display image data in the storage device 66.

Then, the system control unit 52 transmits the display image data to the display device 64, and makes the display device 64 display images indicated by the display image data.

After completion of imaging, the data transmitting connector 710 is detached from the data collecting connector 640. Thereby, when the chest part RF coil device 700 and the data collecting connector 640 are moved beyond the range capable of mutual radio communication, the radio communication between both sides and the electric power supply to the chest part RF coil device 700 side are concluded.

Note that, as an instance in FIG. 10, the input of the reference signal starts in Step S1. However, this is only an example. For example, the input of the reference signal may start just before the prescans in Step S3 (i.e. after setting the imaging conditions in Step S2).

The foregoing is a description of the operation of the MRI apparatus 20 according to the present embodiment.

(Effects of the Present Embodiment)

As just described, in the present embodiment, the transmission side and the receiving side are closely fixed to each other in time of the radio communication, and the radio communication via an induced electric field is performed. Therefore, because output power of the radio communication can be more lowered than digital radio communication of conventional technology, the MRI apparatus 20 of the present embodiment easily accommodates to legal regulations in various countries.

In addition to the mutually closely-situated transmission side and receiving side, the output power of the radio communication can be lowered. Therefore, the problem that the transmitted radio waves are reflected off surrounding areas and this degrades own data of radio communication does not occur.

Thus, digitized MR signals can be wirelessly transmitted satisfactorily from the chest part RF coil device 700, the pelvic part RF coil device 800 and the lower limb RF coil device 900 to the control side of the MRI apparatus 20 (the RF receiver 48 side).

In addition, a plurality of the MR signals respectively detected by the plurality of the coil elements (930 and so on) are converted into a serial signal and then wirelessly transmitted. Thus, the necessary number of antennas for transmitting the MR signals (radio communication pathway) is only one pair, and frequency separation for preventing interference is not necessary between each of the MR signals.

In addition, the data collecting connectors 640 are respectively disposed to a plurality of positions, and it is enough to fix the data transmitting connector 710 of the chest part RF coil device 700 to any one of the data collecting connectors 640. Furthermore, the position of each of the data collecting connectors 640 can be slightly changed by each of the cable 34b.

Thus, no matter which part of the object P an RF coil device is loaded on (i.e. no matter where the RF coil device is located on the table 34), the RF coil device and the data collecting connector 640 can be closely fixed to each other and MR signals can be wirelessly transmitted satisfactorily.

In addition, because the electric power supply, the transmission of the gate signals and the transmission of the reference signals to the chest part RF coil device 700, the pelvic part RF coil device 800 and the lower limb RF coil device 900 are wirelessly performed, configuration of the MRI apparatus 20 can be simplified. As a result, cost of manufacturing the MRI apparatus 20 can be reduced.

Moreover, the chest part RF coil device 700, the pelvic part RF coil device 800 and the lower limb RF coil device 900 respectively include the data transmitting connectors 710, 810, 910 and the other-coil connecting connectors 720, 820, 920 of the same structure. Thus, because these three RF coil devices can be connected in series, the MR signals respectively detected by the three RF coil devices can be wirelessly transmitted to one data collecting connector 640 of the control side of the MRI apparatus 20. That is, degree of freedom in methods of connecting RF coil devices is improved.

According to the aforementioned embodiment, digitized MR signals can be wirelessly transmitted from an RF coil device to an MRI apparatus satisfactorily, in MRI.

In addition, because a plurality of RF coil devices can be connected in series, degree of freedom in methods of connecting RF coil devices is improved.

<Supplementary Notes of the Present Embodiment>

[1] In the present embodiment, an example in which three RF coil devices (the chest part RF coil device 700, the pelvic part RF coil device 800 and the lower limb RF coil device 900) are connected in series has been explained. However, the embodiments of the present invention are not limited to such an aspect.

Two, four or more than four of RF coil devices may be connected in series and all the detected MR signals may be wirelessly transmitted from one of these mutually connected RF coil devices to one the data collecting connector 640 of the control side of the MRI apparatus 20, in the same principle as the above embodiment.

In addition, the embodiments of the present invention is not limited to the chest part RF coil device 700, the pelvic part RF coil device 800 or the lower limb RF coil device 900, but can be applied to RF coil devices for other imaging parts such as a head part RF coil device, a shoulder RF coil device in the same principle as the above embodiment.

[2] The number and arrangement position of the data collecting connectors 640 are not limited to the aspect shown in FIG. 2 and FIG. 3. The data collecting connectors 640 may be, for example, disposed on the table 34 or on the gantry 21 so as to be exposed. Alternatively, the data collecting connectors 640 may be disposed on the bed 32.

For example, the data collecting connectors 640 may be fixed to the interior wall of the gantry 21 or the entrance of the gantry 21, and each cable CA of the chest part RF coil device 700, the pelvic part RF coil device 800 and the lower limb RF coil device 900 may be lengthened.

Figure 11:
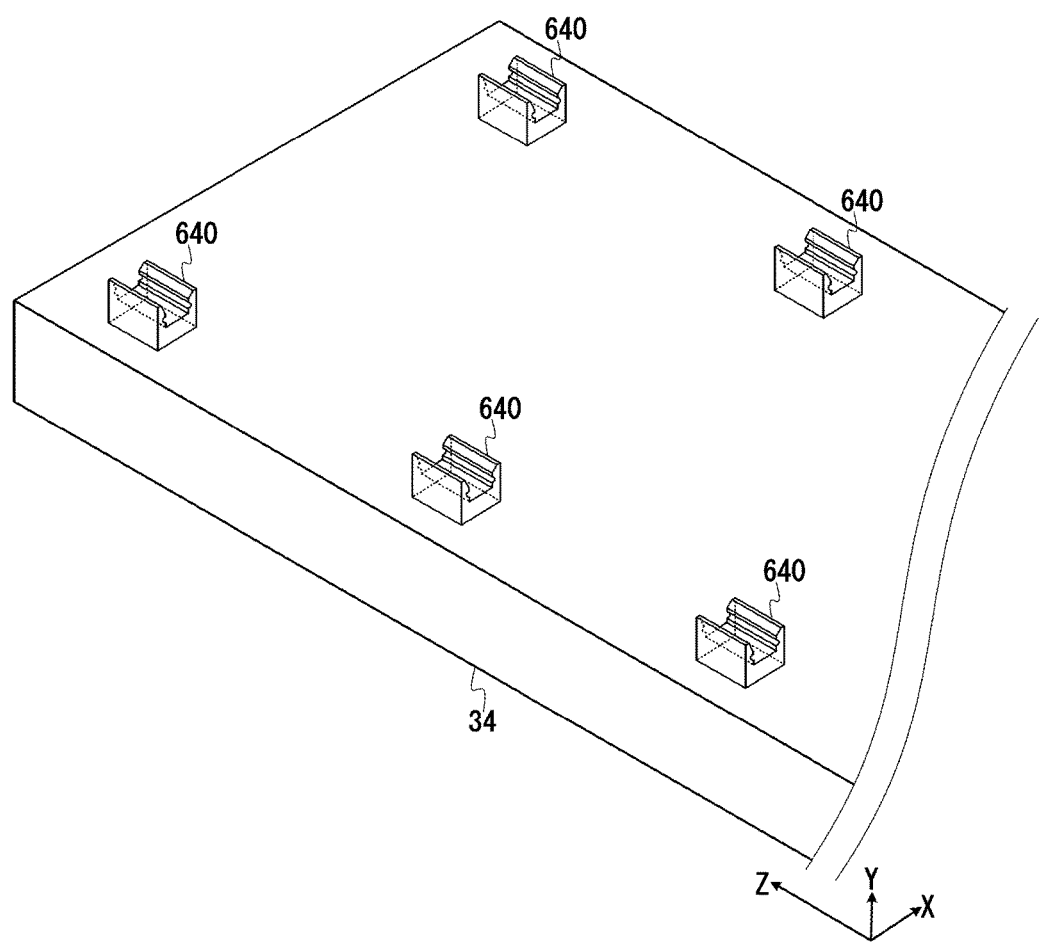
FIG. 11 is a schematic oblique drawing showing a case in which data collecting connectors are fixedly arranged on the table as a derivative version of the present embodiment.

Alternatively, the data collecting connectors 640 may be fixed to the top surface of the table 34 without forming the storage openings 34a in the table 34, like the schematic oblique drawing of the table 34 in FIG. 11. As just described, the position of each of the data collecting connectors 640 does not need to be changeable within the range of the length of the cable 34b.

Figure 12:
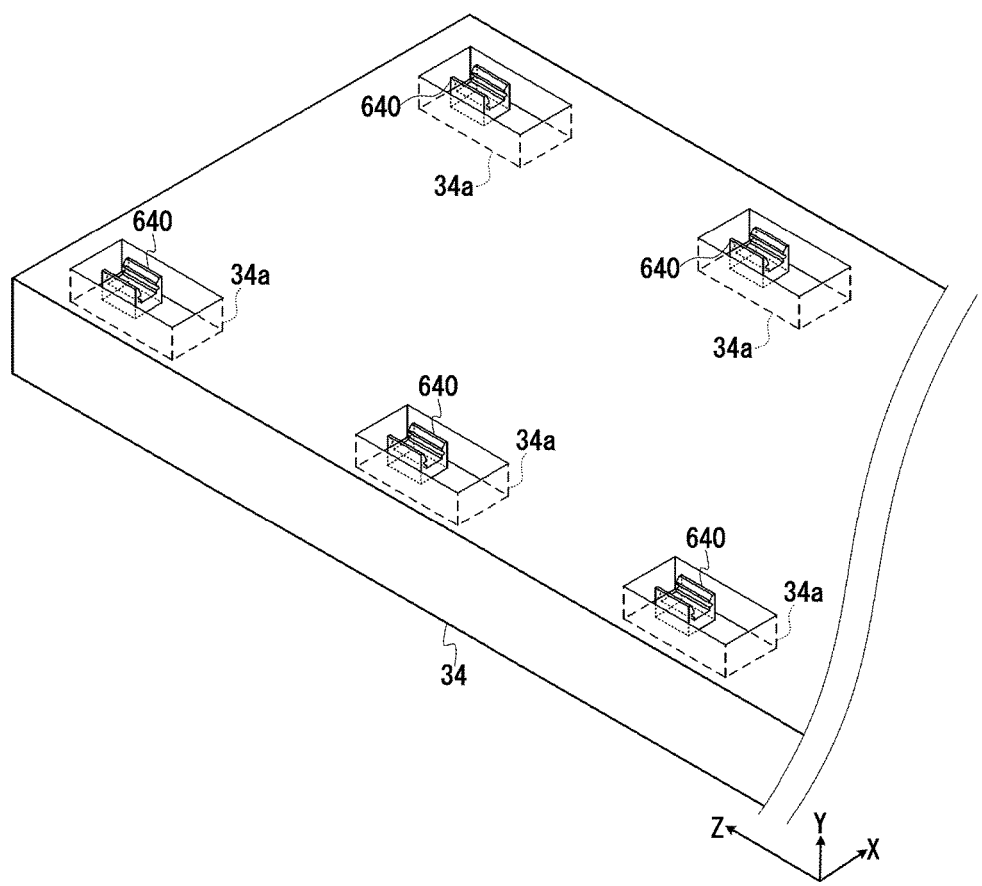
FIG. 12 is a schematic oblique drawing showing a case in which the data collecting connectors are fixedly arranged on bottom faces of the storage openings of the table as another derivative version of the present embodiment.

Alternatively, the data collecting connector 640 may be fixed to the bottom surface of the storage opening 34a of the table 34 by omitting the cable 34b, like the schematic oblique drawing of the table 34 in FIG. 12.

Alternatively, in FIG. 3, the top surface of the table 34 may be flatly shaped without forming the storage openings 34a. In this case, for example, the cables 34b are exposed out of the top surface of the table 34, and the data collecting connector 640 is similarly connected to one end of each of these cables 34b. Then, MR signals are transmitted from the data collecting connector 640 side to the RF receiver 48 (the image reconstruction unit 56 side) via hard-wiring inside the table 34 connected to each of the cables 34b, in the same way as above. In this case, the position of each of the data collecting connectors 640 can be also changed on the table 34 within a predetermined range (i.e. within the range of the aforementioned length of the cable 34b).

If the storage openings 34a are not formed like above, the MRI apparatus 20 may be configured in such a manner that each of the data collecting connectors 640 can be detachably fixed to anywhere in the range of its movement on the top surface of the table 34.

More specifically, for example, out of the male side and the female side of a hook-and-loop fastener such as VELCRO (Trademark), one side may be fixed to the bottom surface of the data collecting connector 640 and the other side may be fixed to the top surface of the table 34 (with a size of the above range of movement).

By taking the above structure, the following problem is prevented. That is, the problem that an RF coil device is moved by the movement of the object P in time of communication causing the connection unit for radio communication connection via an induced electric field to move and this lead to a communication error is prevented.

Note that the fixing method is not limited to the hook-and-loop fastener.

[3] An example in which MR signals are wirelessly transmitted as a serial signal including the identification number of each coil element and the identification information of each RF coil device in a time division manner has been explained (see FIG. 9). However, the embodiments of the present invention are not limited to such an aspect.

For example, by adding another radio communication pathway, information indicating that the currently transmitted signal corresponds to which coil element of which RF coil device may be wirelessly transmitted in synchronization with transmission of MR signals.

Alternatively, MR signals may be wirelessly transmitted as parallel signals by means of such as increasing the number of antennas for transmission and reception of MR signals.

[4] The RF receiver 48 may be included not outside the gantry 21 but inside the gantry 21. In this case, for example, an electronic circuit board that is equivalent to the RF receiver 48 may be disposed in the gantry 21. Then, the MR signals inputted from the chest part RF coil device 700, the pelvic part RF coil device 800, the lower limb RF coil device 900 and the reception RF coil 29 are outputted as digital signals and inputted into the image reconstruction unit 56.

In outputting the signal to the outside of the gantry 21, for example, an optical communication cable is preferably used to transmit the signals in the form of optical digital signals. This is because the effect of external noise is reduced.

[5] Correspondences between terms used in the claims and terms used in the embodiment described above will be described. Note that the correspondences described below are just some of possible interpretations for reference and should not be construed as limiting the present invention.

The data collecting connector 640 is an example of a radio communication unit described in the claims.

In the example of interconnection shown in FIG. 6 to FIG. 8, the chest part RF coil device 700 is an example of the first RF coil device described in the claims, and the pelvic part RF coil device 800 is an example of the second RF coil device described in the claims.

In the example of interconnection shown in FIG. 6 to FIG. 8, the other-coil connecting connector 720 of the chest part RF coil device 700 is an example of the other-coil connecting unit described in the claims, and the data transmitting connector 810 of the pelvic part RF coil device 800 is an example of the signal transmitting unit described in the claim.

The other-coil connecting connectors 720, 820 and 920 are examples of the first communication unit described in the claims.

The data transmitting connectors 710, 810 and 910 are examples of the second communication unit described in the claims.

[6] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
an RF coil device configured to include a coil element configured to detect a nuclear magnetic resonance signal emitted from an object;

a first communication unit configured to be connected to another RF coil device via an induced electric field, and to receive a digitized nuclear magnetic resonance signal wirelessly transmitted from said another RF coil device; and a second communication unit configured to wirelessly transmit the nuclear magnetic resonance signal received by the first communication unit and the nuclear magnetic resonance signal detected by said coil element in a digitized state via an induced electric field;

a radio communication unit configured to receive the nuclear magnetic resonance signals wirelessly transmitted from the second communication unit of the RF coil device via the induced electric field; and an image reconstruction unit configured to reconstruct image data of the object based on the nuclear magnetic resonance signal received by the radio communication unit.

2. The magnetic resonance imaging apparatus according to claim 1, further comprising:

a table on which the object is placed; and a cable whose one end side is connected to the radio communication unit end side and an opposite end side is connected to the table, wherein the cable is configured to electrically connect the radio communication unit to the image reconstruction unit side via hard-wiring inside the table.

3. The magnetic resonance imaging apparatus according to claim 2, wherein a storage opening in which the radio communication unit and the cable are placed is formed in the table.

4. The magnetic resonance imaging apparatus according to claim 2, wherein the radio communication unit is fixedly arranged on the table.

5. A magnetic resonance imaging apparatus obtaining a nuclear magnetic resonance signal from an RF coil device which detects the nuclear magnetic resonance signal emitted from an object, the magnetic resonance imaging apparatus comprising:

a table on which the object is placed;

a first radio communication unit configured to obtain the nuclear magnetic resonance signal detected by the RF coil device, and wirelessly transmit the nuclear magnetic resonance signal in a digitized state via an induced electric field;

a second radio communication unit configured to be connected to hard-wiring inside the table by wire, be disposed on the table so as to be able to change position, and receive the nuclear magnetic resonance signal wirelessly transmitted from the first radio communication unit via the induced electric field; and an image reconstruction unit configured to reconstruct image data of the object, based on the nuclear magnetic resonance signal transmitted via the hard-wiring inside the table after being received by the second radio communication unit.

6. An RF coil device transmitting a nuclear magnetic resonance signal to a magnetic resonance imaging apparatus, the RF coil device comprising:

a coil element configured to detect the nuclear magnetic resonance signal emitted from an object;

a first communication unit configured to be connected to another RF coil device via an induced electric field, and receive a digitized nuclear magnetic resonance signal wirelessly transmitted from said another RF coil device; and a second communication unit configured to wirelessly transmit the nuclear magnetic resonance signal received by the first communication unit and the nuclear magnetic resonance signal detected by coil element in a digitized state to the magnetic resonance imaging apparatus, via an induced electric field.

* * * * *